(12) United States Patent
Zenker et al.

(10) Patent No.: US 10,037,117 B2
(45) Date of Patent: Jul. 31, 2018

(54) TWO-DIMENSIONAL SENSOR ARRANGEMENT

(71) Applicant: SCHOTT AG, Mainz (DE)

(72) Inventors: Thomas Zenker, Nieder-Olm (DE);
Franziska Back, Schweinfurth (DE);
Franziska Riethmueller, Frankfurt am Main (DE)

(73) Assignee: SCHOTT AG, Mainz (DE)

( * ) Notice: Subject to any disclaimer, the term of this patent is extended or adjusted under 35 U.S.C. 154(b) by 0 days.

(21) Appl. No.: 15/347,175

(22) Filed: Nov. 9, 2016

(65) Prior Publication Data

US 2017/0160835 A1 Jun. 8, 2017

(30) Foreign Application Priority Data

Nov. 9, 2015 (DE) .......... 10 2015 119 289
Nov. 20, 2015 (DE) .......... 10 2015 120 168
Jul. 18, 2016 (DE) .......... 10 2016 113 162

(51) Int. Cl.
*G06F 3/044* (2006.01)
*F24C 7/08* (2006.01)
*G06F 3/041* (2006.01)

(52) U.S. Cl.
CPC .......... *G06F 3/044* (2013.01); *F24C 7/086* (2013.01); *G06F 3/0412* (2013.01); *G06F 3/0416* (2013.01); *G06F 2203/04103* (2013.01); *G06F 2203/04104* (2013.01); *G06F 2203/04107* (2013.01); *G06F 2203/04108* (2013.01)

(58) Field of Classification Search
CPC .......... G06F 3/041–3/047; G06F 2203/04103
USPC ...... 178/18.01–19.07; 345/173–178
See application file for complete search history.

(56) References Cited

U.S. PATENT DOCUMENTS

| | | | |
|---|---|---|---|
| 5,113,041 | A | 5/1992 | Blonder et al. |
| 5,463,388 | A | 10/1995 | Bole et al. |
| 7,821,502 | B2 | 10/2010 | Hristov |
| 8,319,747 | B2 | 11/2012 | Hotelling et al. |
| 8,754,662 | B1 | 6/2014 | Weng et al. |
| 9,081,453 | B2 | 7/2015 | Bulea et al. |
| 2004/0125087 | A1 | 7/2004 | Taylor et al. |
| 2008/0312857 | A1 | 12/2008 | Sequine |
| 2010/0134422 | A1 | 6/2010 | Borras |
| 2011/0022351 | A1 | 1/2011 | Philipp et al. |
| 2011/0248962 | A1 | 10/2011 | Poupyrev |

(Continued)

FOREIGN PATENT DOCUMENTS

| | | |
|---|---|---|
| DE | 102004026836 | 12/2005 |
| DE | 202006010488 | 11/2006 |

(Continued)

*Primary Examiner* — Michael Pervan
(74) *Attorney, Agent, or Firm* — Ohlandt, Greeley, Ruggiero & Perle, L.L.P.

(57) ABSTRACT

A two-dimensional sensor arrangement is provided that detects locations, e.g. finger locations, in two or three dimensions, which is particularly suitable for touch-sensitive touchpads or touchscreens. The sensor arrangement includes a sensing zone in which a plurality of sensors are arranged, and contact zone, e.g. externally thereto, in which a plurality of electrically conductive contact points are arranged, which are connected to the sensors. The number of contact points is very small, although the electrically conductive components of the sensor arrangement form a single-layered network.

17 Claims, 15 Drawing Sheets

(56) References Cited

U.S. PATENT DOCUMENTS

| | | |
|---|---|---|
| 2012/0227259 A1* | 9/2012 | Badaye .................. G06F 3/044 |
| | | 29/846 |
| 2012/0327016 A1 | 12/2012 | Hristov |
| 2013/0100041 A1 | 4/2013 | Golovchenko et al. |
| 2013/0147751 A1 | 6/2013 | Bunuel |
| 2014/0202840 A1 | 7/2014 | Fix et al. |
| 2014/0327848 A1 | 11/2014 | Fix et al. |
| 2015/0116254 A1 | 4/2015 | Solven |
| 2015/0261348 A1 | 9/2015 | Jang et al. |
| 2016/0120028 A1* | 4/2016 | Bach .................. H05K 1/0274 |
| | | 345/174 |
| 2016/0154517 A1 | 6/2016 | Ullmann et al. |
| 2016/0170518 A1 | 6/2016 | Donnelly |
| 2016/0188034 A1* | 6/2016 | Bayramoglu .......... G06F 3/044 |
| | | 345/174 |
| 2016/0334919 A1 | 11/2016 | Zhu |

FOREIGN PATENT DOCUMENTS

| | | |
|---|---|---|
| DE | 102005027199 | 12/2006 |
| DE | 102005041114 | 3/2007 |
| DE | 112008001245 | 3/2010 |
| DE | 102008050215 | 4/2010 |
| DE | 102010030315 | 12/2011 |
| DE | 102011108153 | 1/2013 |
| DE | 102011122110 | 6/2013 |
| DE | 102013104644 A1 | 11/2014 |
| DE | 102014219348 | 3/2016 |
| EP | 2472186 | 7/2012 |
| WO | 2012032432 | 3/2012 |

* cited by examiner

FIG. 1a     FIG. 1b     FIG. 1c     FIG. 1d
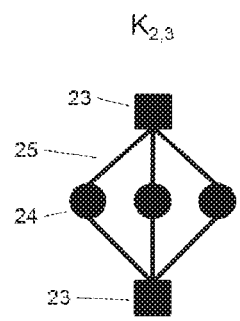 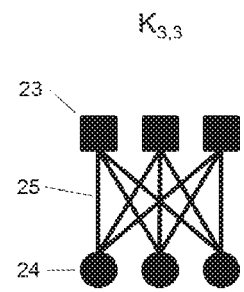 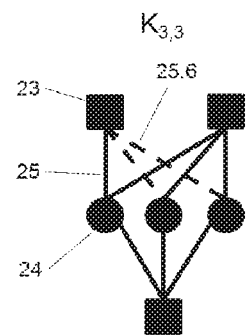 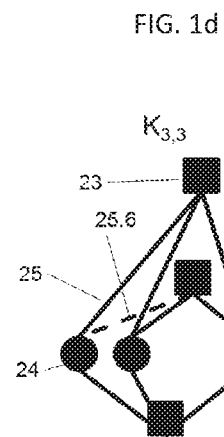
FIG. 2a    FIG. 2b    FIG. 2c    FIG. 2d    FIG. 2e
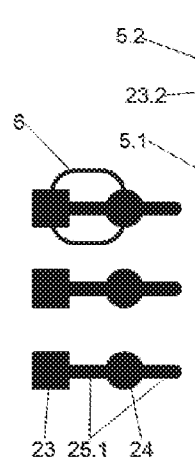 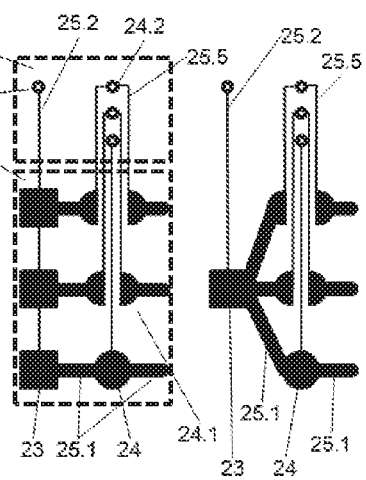 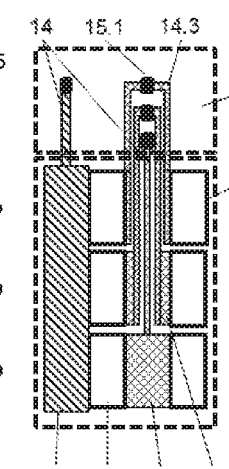 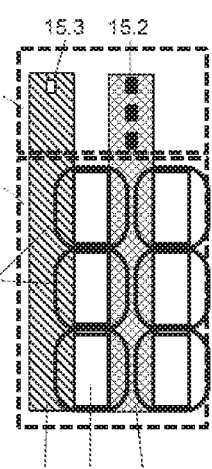

SF(8x6;5;24)

SF(8x6;4;24)

FIG. 5a
FIG. 5b
FIG. 5c
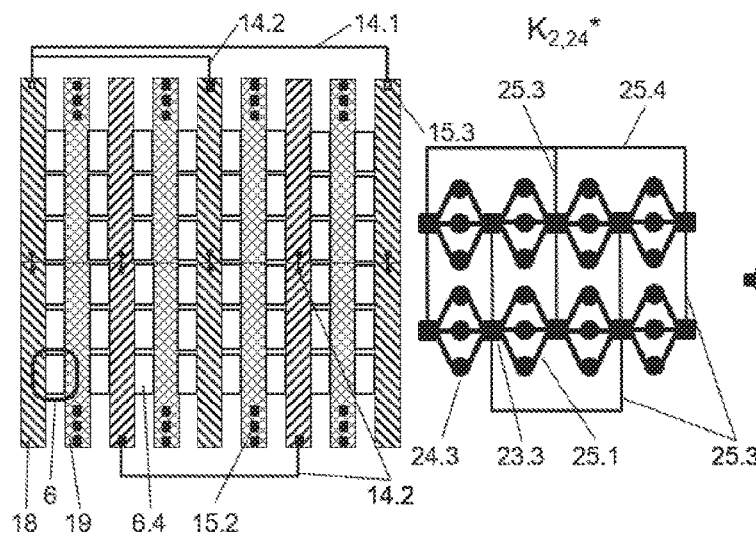
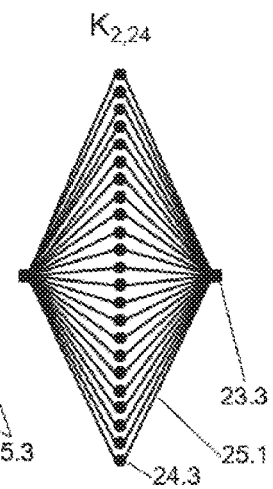
SF(8x6;2;24)
FIG. 6
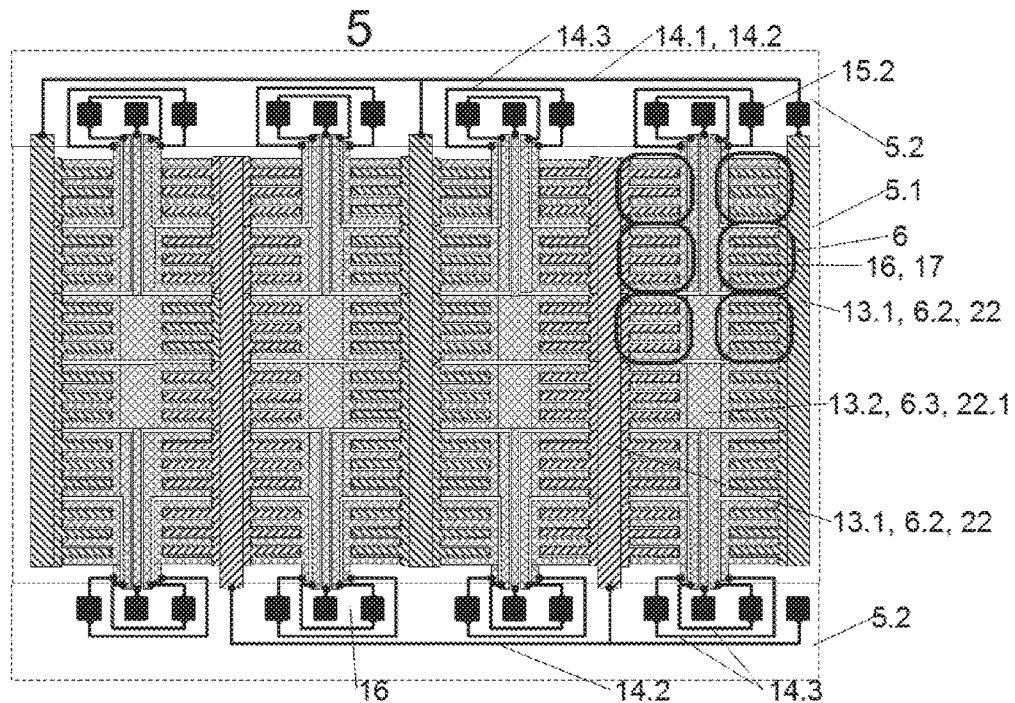

SF(12x8;28;30)

SF(12x8;24;24)

FIG. 9c  FIG. 9d  FIG. 9e  FIG. 9f  FIG. 9g
     
$\dfrac{uv}{4}+\dfrac{u}{2}$  $\dfrac{uv}{4}+\dfrac{u}{4}$  $\dfrac{uv}{4}+\dfrac{u}{6}$  $\dfrac{uv}{4}+2$  $\dfrac{uv}{4}+2$ FIG. 13a  FIG. 13b
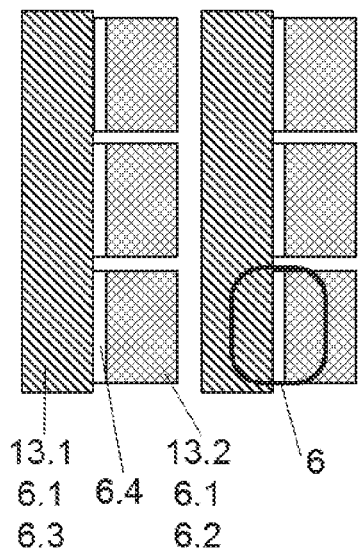
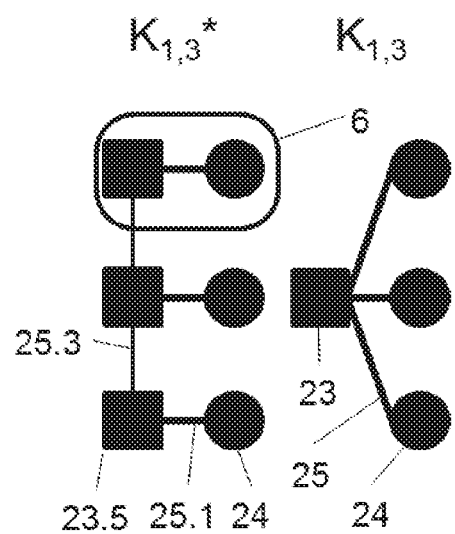
FIG. 14a  FIG. 14b  FIG. 14c
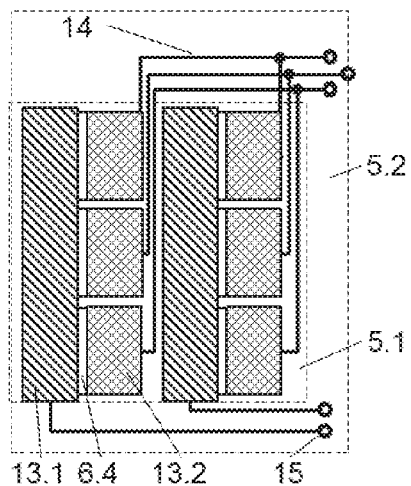
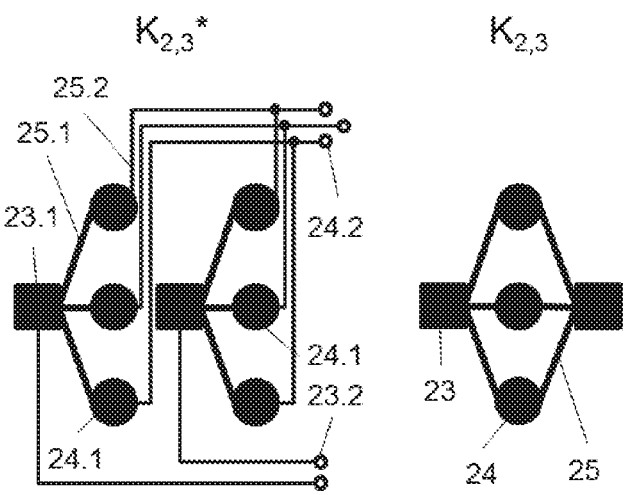

FIG. 15a  FIG. 15b  FIG. 15c  FIG. 15d
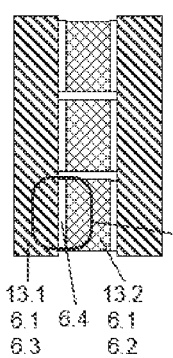
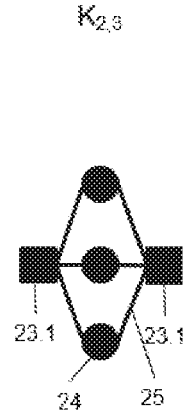
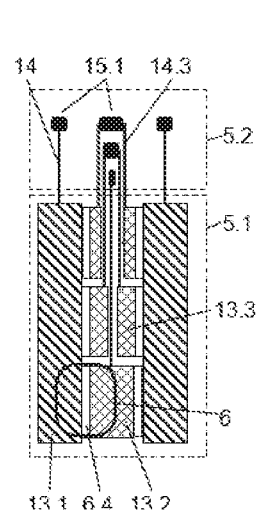
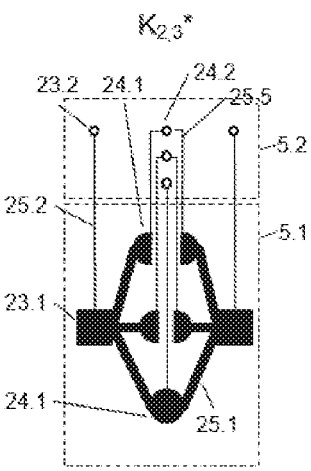
FIG. 16a  FIG. 16b
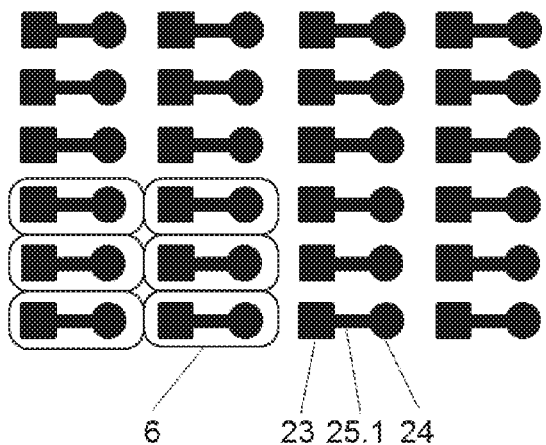
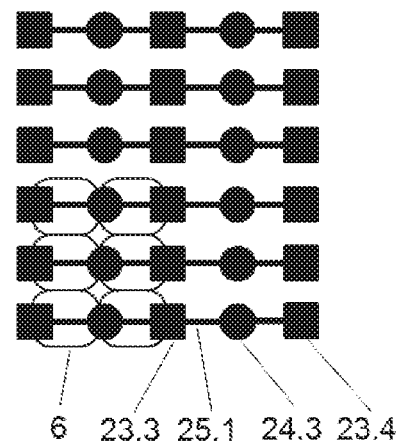

TWO-DIMENSIONAL SENSOR ARRANGEMENT

CROSS REFERENCE TO RELATED APPLICATIONS

This application claims the benefit under 35 U.S.C. 119 of German Application No. 102015119289.6 filed on Nov. 9, 2015 and claims the benefit under 35 U.S.C. 119 of German Application No. 102015120168.2 filed on Nov. 20, 2015, the entire contents of both of which are incorporated by reference herein.

BACKGROUND

1. Field of the Invention

The invention relates to a two-dimensional sensor arrangement for detecting locations in two or three dimensions, in particular for touchpads or touchscreens.

2. Description of Related Art

Touch-sensitive touchpads and touchscreens are highly popular for operating electronic devices, which is not least due to the comfort of controlling the devices by swiping gestures and similar operating patterns.

Touch-sensitive sensor arrays are nowadays typically used to determine the location of one or more items within a two-dimensional sensing zone, and such sensor arrays may be disposed in front of a display screen. This enables the user to select items within the sensing zone by touching with a finger or a touching utensil, such as a conductive stylus, to move or shift items on a screen by swiping, to select, increment, or decrement alphanumeric settings by swiping or scrolling, etc.

A touch-sensitive sensor array comprises an arrangement of a plurality of sensors which in case of capacitive sensor arrays, for example, are mostly implemented in the form of projected capacitive (PCAP) sensing cells. The sensing cells in turn are usually made up of two sensor electrodes, i.e. a first and a second sensor electrode which are spaced apart by an interspace, in particular a gap. In the region of a sensor gap, i.e. between the pair of electrodes, an electric field may be generated which will change in the event of a controlling touch so that an electrical touch signature can be detected at the electrodes. The two sensor electrodes can selectively assume the function of a transmitting electrode and a receiving electrode so that the touch signature can be detected at the receiving electrode.

Contact points which are connected to the electrodes and are typically arranged in a contact zone outside the sensing zone are used to connect the electrodes to an electronic controller unit. The controller unit can feed signals into the transmitting electrode and can receive signals from the receiving electrode to evaluate them with regard to a touch signature.

In practice, the electrodes, the contact points, and the interconnections therebetween are typically applied on a two-dimensional substrate, directly or indirectly, and are designed as conductive patterns, in particular as conductive areas.

Interconnection of the contact points with the electrodes, i.e. the electrical connection between the contact points and the electrodes is only rarely made in the particularly simple manner of associating exactly one electrode of a sensor to each contact point. This would result in a very great number of contact points equal to the number of sensor electrodes.

In practice, a great number of contact points would result in a number of drawbacks. On the one hand, high complexity of the conductor layers on a substrate would result, and therefore a high error rate and operational instability in general. This in particular includes high susceptibility to interference due to interference fields due to closely arranged connecting conductors, i.e. the density of conductive tracks. Furthermore, complex and error-prone contacting of the sensor array is required, and the connected control electronics is also highly complex due to the multiplicity of signal inputs and outputs. Moreover, a great number of contact points usually implies longer conductive tracks, which may impair the response time of the sensor array and which adds to complexity in manufacturing. Therefore, it is desirable to reduce the number of contact points.

In order to reduce the number of contact points, a contact point is often connected to a plurality of electrodes, but in such a way that each pair of electrodes of a sensor, that is to say each sensor continues to be associated with a unique pair of contact points.

To this end, a contact point must not be connected to two electrodes of the same sensor but only to a plurality of sensor electrodes each of which belong to a different sensor. Accordingly, the contact points may be divided into two sets: a first set comprising those contact points which are connected to first electrodes, and a second set which comprise those contact points which are connected to second electrodes. If the first set consists of a number M of contact points and the second set consists of a number N of contact points, this is referred to as an M:N interconnection. Sometimes, this is referred to as an interconnection in an M:N matrix.

An M:N interconnection of the sensor electrodes is often implemented by electrically connecting some of the electrodes not only in the contact zone but already in the sensing zone and then connecting such a combination of joined sensor electrodes to one of the contact points in the contact zone. In this context, it should be noted that the connection of a plurality of sensor electrodes is of course equivalent to the use of one and the same large-area electrode for a plurality of sensors.

If first electrodes are already interconnected in the sensing zone, only a smaller number of independent first electrodes will be left compared to the original number of first electrodes which corresponds to the number of sensors, and this smaller number is designated as R herein. Similarly, an interconnection of second electrodes in the sensing zone results in a reduced number of independent second electrodes, which is designated as a number S herein. This is then referred to as an R:S interconnection in the sensing zone. Thus, a total of R+S connecting conductors is obtained which extend to the contact zone.

In particularly simple arrangements, each of the R+S connecting conductors is directly connected to a contact point in the contact zone, so that a number of M=R contact points of the first set and a number of N=S contact points of the second set is found. Therefore, the number of contact points will be M+N=R+S. However, in most applications the number of contact points is further reduced by first making a further interconnection in the contact zone so as to obtain M+N<R+S connecting conductors which are then routed to the contact points.

The physical arrangement of the sensors in the sensing zone is often implemented in the form of a matrix, i.e. a number of K*L sensors is arranged in K columns and L rows (K:L matrix) in the sensing zone.

For a sensor arrangement in the form of a K:L matrix it is known to apply a number of K electrode strips in the column direction in a first layer on a substrate, and to arrange a number of L electrode strips in the row direction in a superposed second layer. In this way, only M=K contact points of the first set and N=L contact points of the second set are required for K*L sensors. However, a plurality of superimposed layers are required. In other words, the electrode strips in the column direction are crossing those in the row direction, as seen in a projection on the substrate surface.

A similar implementation is disclosed in U.S. Pat. No. 5,113,041, for example, which describes a device for determining the location of a stylus tip in two dimensions in units of spacing intervals in equidistantly spaced patterns of conductive strips. One set of such conductive strip patterns extends in the x-direction and a similar set extends in the y-direction, the two sets being separated by a thin layer of insulating material which should advantageously be designed so as to be as thin as possible. Accordingly, three superimposed layers are employed in the sensing zone: one layer for the strips in the x-direction, one layer for the strips in the y-direction, and an insulation layer disposed therebetween. The strips running in the x-direction are crossing the strips running in the y-direction.

U.S. Pat. No. 5,463,388 discloses a computer input device comprising electrodes arranged in a grid pattern, which are connected in rows and columns, some of the electrodes being interconnected to one another by lines. The lines intersect in the sensing zone. Accordingly, a plurality of superimposed layers are required at least at the crossing points in the sensing zone.

The aforementioned teachings include crossings in the sensing zone, or in other words they comprise a multilayered structure. A particular drawback of a multilayered structure is the complex manufacturing process. While in single-layered configurations only a single conductive material layer needs to be applied on a substrate, a multilayered structure requires to alternately apply conductive and insulating materials.

In the case of transparent sensor arrays, however, a multilayered structure is furthermore disadvantageous in terms of optical properties. Transparent sensor arrays are in particular arranged in front of a screen, as a touch-sensitive layer for producing touchscreens. A multilayered structure causes the sensor arrays to be thicker, so that transmittance is lower and the haze value which is a measure of the opacity of transparent samples is higher. Moreover, both conductive and insulating transparent materials are required at the same time, and the refractive indices thereof might be different, which may lead to loss in transmittance. All this affects the display characteristics of a touchscreen.

Crossings furthermore have the disadvantage that the intersecting conductive patterns form unwanted pseudo-sensing cells which may cause interference in the control electronics.

It has been known to make crossing-free, i.e. single-layered interconnections at least in the sensing zone, while intersecting structures are displaced to the contact zone or elsewhere. With this compromise, the number of contact points can be kept small: typical are M:N interconnections which in turn correspond to the physical arrangement of the sensors in K columns and L rows, i.e. M=K and N=L.

Such or similar teachings are found in part in U.S. Pat. No. 9,081,453; DE 20 2006 010 488 U1; U.S. Pat. No. 8,319,747 B2; DE 10 2011 122 110 A1; DE 11 2008 001 245 T5; DE 10 2008 050 215 A1; DE 10 2011 108 153 A1; US 2015/0261348 A1.

However, even if the crossing of conductive patterns is not implemented in the sensing zone but in the contact zone (peripheral area), the drawback of complex manufacturing remains. The crossing interconnections between conductive patterns need to be realized via the third dimension perpendicularly to the two-dimensional sensor area, so that a single two-dimensional layer is not sufficient to enable interconnection.

The aforementioned drawbacks also apply to an embodiment of U.S. Pat. No. 9,081,453 which discloses a sensor array with a sensor controller, since a controller is not a single-layered component.

Accordingly, a sensor arrangement which can be produced in a single layer would be desirable, in particular for producing sensor arrays by printing conductive material onto a substrate, e.g. by screen printing.

While in multilayered conductive layer structures as described above the electrode gaps are mostly defined vertically, by superposing two conductive areas which are galvanically separated from one another by an insulating layer, in single-layered conductive layer structures the gap is typically defined by a lateral spacing between two conductive areas applied on the same substrate, that is, for example, by a galvanically insulating gap (sensor gap).

US 2004/0125087 A1 and U.S. Pat. No. 8,754,662 B1 disclose sensor arrays which can be produced with a single layer of conductive material. However, these sensor arrays need to be improved in terms of the number of contact points.

Furthermore, single-layered sensor arrangements are known in which some of the electrodes are connected to the contact points in such a manner that interconnections are routed through gaps between first and second electrodes of other sensors. However, this leads to the creation of undesirable pseudo-sensing cells and may in particular result in interfering capacitances. This may lead to undesirable interferences in control and evaluation and a more complex control electronics may be required.

Moreover, some known sensor arrangements are only provided for a fixed number of columns and/or rows, so that the size of the sensor array is not scalable with the same positioning resolution. Against this background it would be advantageous to have interconnection patterns which allow the size of the sensor arrangement to be scaled for a defined resolution.

German patent applications DE 10 2015 112 317.7 and DE 10 2016 113 162.8 are hereby fully incorporated by reference.

SUMMARY

An object of the invention is to provide sensor arrangements for two-dimensional determination of locations which can be operated via contact points and which arrangements are formed in a single layer on the one hand, i.e. free of crossings, and for which, on the other hand, a ratio of the number of contact points to the number of sensors is particularly low.

One aspect of the object is to make the interconnections of the sensor electrodes and contact points such that no conductive interconnections extend through the gaps between the electrodes of a sensor.

A further aspect of the object is to provide scalable interconnection patterns of electrodes and contact points which permit to produce two-dimensional sensor arrays of variable height and/or width and with definable resolution of the location determination.

According to the invention, a two-dimensional sensor arrangement for detecting locations, e.g. finger locations, in two or three dimensions is provided, which is particularly suitable for touchpads or touchscreens. With regard to the detection of locations in three dimensions, a three-dimensional supporting gesture control may in particular be provided by detecting operating items at a distance above the operating surface.

The sensor arrangement comprises a sensing zone in which a plurality of sensors are arranged, in particular capacitive sensors, and a contact zone in which a plurality of electrically conductive contact points are arranged.

The sensors each comprise an electrode pair consisting of a first electrode and a second electrode spaced apart from the first electrode by an electrically insulating electrode interspace, e.g. a gap.

Electrical interconnections are provided between the electrodes and the contact points in such a manner that each of the electrodes is connected to one of the contact points and each of the contact points is connected to one or more of the electrodes. In other words, each of the electrodes is connected to exactly one of the contact points, while each of the contact points is connected to one or more of the electrodes.

However, electrical connections between the first and second electrodes are undesirable. Accordingly, each of the contact points is either connected to one or more of the first electrodes or to one or more of the second electrodes. This means that the contact points are divided into two sets. So, a first and a second set of contact points is defined, the first set comprising those contact points which are connected to the one or more first electrode(s), and the second set comprising those contact points which are connected to the one or more second electrode(s).

Furthermore it is contemplated that the electrode pair of a sensor is connected to a unique pair of contact points in each case. Mathematically spoken this means that the set of electrode pairs corresponding to the sensors is injectively mapped to the set of all arbitrarily defined pairs of contact points.

In other words, any arbitrarily formed pair consisting of one of the contact points of the first set and one of the contact points of the second set is connected as a pair to the electrode pair of not more than one of the sensors. Connected as a pair herein means that both the first electrode is connected to the contact point of the first set and the second electrode is connected to the contact point of the second set.

The electrical interconnections between the electrodes and the contact points are either direct or in the form of an electrically conductive electrode conductor. Accordingly, a contact point may either be bonded directly to one of the electrodes or may be connected to one or more electrodes via one or more connecting conductors.

The contact points, the electrode conductors, and the electrodes collectively form a plurality of electrically conductive conduction areas. The conduction areas each comprise one of the contact points and the electrodes and/or electrode conductors connected to the respective contact point. In other words, each of the conduction areas comprises exactly one contact point and all electrodes and electrode conductors connected thereto, if the respective contact point has electrode conductors electrically connected thereto. Accordingly, each of the conduction areas constitutes an interconnected electrically conductive component which is electrically insulated from the other conduction areas.

Since each conduction area comprises exactly one contact point, the number of conduction areas is the same as the number of contact points.

According to the invention, the conduction areas form a single-layered network. It is in particular possible to apply all conduction areas onto a substrate in the same plane. The fact that the conduction areas form a single-layered network therefore means within the scope of the invention that the plurality of conduction areas can be applied on a substrate in a single layer. In other words, none of the conduction areas crosses another conduction area, as seen in the projection of the conduction areas to the two dimensions of the sensor arrangement. In this sense, it can synonymously be stated that the conduction areas form a crossing-free network. That means that none of the conduction areas is located vertically above or below another conduction area with respect to the substrate, even not partially.

A conduction area as an interconnected electrically conductive component need not necessarily consist of only one conductive material. It may as well be contemplated that a conduction area consists of a plurality of different conductive materials. In particular the contact point included in a conduction area may be made of a different conductive material than the one or more electrode(s) included in the conduction area. Also, one or more electrode conductors, if included in a conduction area, may be made of a different conductive material than the one or more electrode(s) or than the contact point. It may as well be contemplated that a conduction area comprises transparent conductive material in the sensing zone and opaque conductive material in the contact zone, in which case the transparent and opaque conductive materials are connected to one another in an electrically conductive manner. Accordingly, transparent material may be applied in the sensing zone and opaque material in the contact zone (for instance in two steps) and for contacting purposes (to form a conduction area) the transparent and opaque materials overlap conductively at the transitions.

Generally, therefore, a conduction area comprises all elements which are conductively connected to a contact point, irrespectively of the conductive material. Different conductive materials which together form a conduction area, i.e. which are conductively connected to each other, may as well be arranged vertically with respect to the substrate in order to establish an electrical connection. In other words, it is possible for different conductive materials to be arranged one on top of the other as long as they belong to the same conduction area. By contrast, conductive material of two different conduction areas is applied side by side on the substrate, according to the invention.

The creation of a single-layered network, i.e. without crossings, has a variety of advantages: It is possible to produce a sensor array by simply applying a single layer of conductive material onto a substrate. The application may in particular be accomplished using very simple processes such as printing. Because only a thin conductive layer is needed, it is possible to produce sensor arrays with very high transmission and low Haze value when using transparent conductive material. In particular transmission losses as caused by different refractive indices between conductive and insulating material layers are avoided. Furthermore, since a single-layered network does not include crossings of conduction areas, a generation of interfering pseudo-sensing cells at the locations of the crossings is avoided.

It is in particular contemplated that the electrode interspaces, i.e. the gaps between the first and second electrodes of the sensors, are arranged so as to only be adjacent to those two conduction areas which comprise the first and the second electrode of the respective sensor.

This means in particular that electrode conductors to other electrodes do not run through any of the electrode gaps between a pair of electrodes. As a result, the formation of pseudo-sensing cells and interfering capacitances can advantageously be avoided. Control of the sensor array and evaluation of the locations can therefore be effected very precisely and without complex filtering of the signals.

If it is contemplated that each of the electrode gaps is arranged so as to only be adjacent to the two associated conduction areas, this means in particular that the electrode gaps do not adjoin any of the conduction areas except the two associated conduction areas. However, blind areas may be disposed between the two electrodes of a sensor, as will be explained below.

Some embodiments of the invention which enable to reduce the number of contact points particularly significantly will now be described. Advantageously, it is possible in this manner, to implement simple, material-saving, and robust error-safe networks which are in particular distinguished by a low density of conductive tracks and a simple way of being contacted and connected to control electronics.

Generally speaking, the sensor arrangement can comprise at least 3, preferably at least 4, even more preferably at least 6, and yet more preferably at least 8 and particularly preferably at least 10 rows adjacent to each other, wherein in each row at least 3 sensors, preferably at least 4 sensors, even more preferably at least 6 sensors and yet more preferably at least 8 sensors and particularly preferably at least 10 sensors may be arranged adjacent to each other.

In one embodiment of the invention, the sensor arrangement comprises a plurality of adjacent rows in each of which some of the sensors are arranged adjacent to each other, the rows at least comprising one row $R_1$, one row $R_2$ adjacent to the row $R_1$, one row $R_3$ adjacent to the row $R_2$, and one row $R_4$ adjacent to the row $R_3$. The rows may in particular be rows or columns of a matrix-type arrangement of sensors.

In this embodiment, the following interconnection is contemplated: The first electrodes of the sensors arranged in the row $R_1$ and the first electrodes of the sensors arranged in the row $R_4$ are connected to a respective common contact point which is designated as A. The first electrodes of the sensors arranged in the row $R_2$ and the first electrodes of the sensors arranged in the row $R_3$ are connected to a respective common contact point, in particular to a contact point different from the contact point designated as A. The second electrodes of the sensors arranged in the row $R_1$ and the second electrodes of the sensors arranged in the row $R_4$ are connected to respective different contact points which are designated as a plurality B. The second electrodes of the sensors arranged in the row $R_2$ and the second electrodes of the sensors arranged in the row $R_3$ are connected to respective different contact points, in particular to the contact points designated as plurality B, and in particular in the same order of the contact points in the rows.

If above or below an electrode of a sensor is referred to as a first or as a second electrode, this means any one of the two electrodes of the sensor, unless only one of the two electrodes is left under consideration of the conditions of the invention in terms of interconnections of electrodes and contact points.

Preferably at least 3 sensors are arranged in each of the rows, more preferably at least 4, most preferably at least 6 sensors. Preferably, at least 8 adjacent rows are included, in particular with rows 1 to 4 interconnected as described above, and preferably with rows 5 to 8 also interconnected as described above, and most preferably with rows 3 to 6 also interconnected as described above. An exemplary sensor arrangement including 8 adjacent rows and 6 sensors in each row is illustrated in FIGS. 5a through 5c.

In a refinement of the above embodiment of the invention, the rows comprise two peripheral rows R and R' which are distinguished by the fact of each having only one adjacent row. The peripheral rows may in particular be peripheral with respect to all sensors arranged in the sensor array.

Interconnection is now provided in such a manner that electrodes in the peripheral rows are reconnected, that is to say the first electrodes of the sensors arranged in the row R and the first electrodes of the sensors arranged in the row R' are connected to a common contact point.

Preferably at least 8 rows are comprised, more preferably at least 12 rows.

In another embodiment of the invention, the sensor arrangement comprises at least one arrangement region in which at least some of the sensors are arranged in a matrix in such a manner that each of the locations of the sensors in the arrangement region can be defined as a position $P_{ij}$ with a row index i and a column index j.

In this embodiment, the following interconnection is contemplated: The first electrodes of the four sensors arranged at the positions $P_{12}$, $P_{22}$, $P_{13}$, and $P_{23}$ are connected to a common contact point which is designated as A. The first electrodes of the four sensors arranged at the positions $P_{32}$, $P_{42}$, $P_{33}$, and $P_{43}$ are connected to a common contact point, in particular to a contact point different from the contact point designated as A. The second electrodes of the four sensors arranged at the positions $P_{21}$, $P_{31}$, $P_{22}$, and $P_{32}$ are connected to a common contact point which is designated as B. The second electrodes of the four sensors arranged at the positions $P_{23}$, $P_{33}$, $P_{24}$, and $P_{34}$ are connected to a common contact point, in particular to a contact point different from the contact point which is designated as B.

The interconnection described above which comprises sensors arranged in a 4:4 matrix, may in particular be considered as an elementary cell. Accordingly, larger area interconnections of sensors arranged in larger m:n matrices as known in principle to a person skilled in the art may be provided according to the same pattern. Preferably, matrices with at least 8 rows and/or 12 columns are provided. A sensor arrangement with an array of sensors in a matrix having 8 rows and 12 columns is illustrated in FIGS. 8a and 8b.

In a first refinement of the aforementioned embodiment of the invention, the matrix comprises two peripheral rows with row indices i=1 and i=m, respectively. These peripheral rows may in particular be peripheral with respect to all sensors arranged in the sensor array.

Interconnection is now provided in such a manner that electrodes of the peripheral rows are reconnected as follows: The second electrodes of the four sensors arranged at the positions $P_{11}$, $P_{12}$, $P_{m1}$, and $P_{m2}$ are connected to a common contact point which is designated as C. The second electrodes of the four sensors arranged at the positions $P_{13}$, $P_{14}$, $P_{m3}$, and $P_{m4}$ are connected to a common contact point, in particular to a contact point different from the contact point designated as C.

The interconnection described above which relates to sensors arranged in an m:4 matrix may again be considered as an elementary cell. Accordingly, similar reconnections may be provided in wider m:n matrices which are known in principle to a person skilled in the art. A sensor arrangement with an array of sensors in a matrix having 8 rows and 12 columns is illustrated in FIGS. 9a through 9g.

In a second refinement of the aforementioned embodiment of the invention the matrix comprises two peripheral columns with column indices j=1 and j=n, respectively. These peripheral columns may in particular again be peripheral with respect to all sensors arranged in the sensor array.

Interconnection is now provided in such a manner that within one or both of the peripheral columns the electrodes are interconnected as follows: The first electrodes of the four sensors arranged at the positions $P_{11}$, $P_{21}$, $P_{51}$, and $P_{61}$ are connected to a common contact point which is designated as D; and/or the first electrodes of the four sensors arranged at the positions $P_{1n}$, $P_{2n}$, $P_{5n}$, and $P_{6n}$ are connected to a common contact point, in particular to a contact point different from the contact point designated as D.

The interconnection described above which relates in particular to sensors arranged in a 6:n matrix may again be considered as an elementary cell. Accordingly, further connections of peripheral electrodes of this type may be provided in longer m:n matrices, as will be known in principle to a person skilled in the art. A sensor arrangement with an array of sensors in a matrix having 8 lines and 12 columns is illustrated in FIG. 9a through 9g. The 6:n elementary cell described is only provided once here. It will multiply only in case of a sensor array having a multiple of 6 rows.

In particular in a larger matrix it may as well be contemplated that the first electrodes of the four sensors arranged at the locations $P_{x,1}$, $P_{x+1,1}$, $P_{x+4,1}$, and $P_{x+5,1}$ are connected to a common contact point which is designated as D', and/or that the first electrodes of the four sensors arranged at the locations $P_{x,n}$, $P_{x+1,n}$, $P_{x+4,n}$, and $P_{x+5,n}$ are connected to a common contact point, in particular to a contact point different from the contact point designated as D', wherein x may in particular assume the values 1, 7, 13, 19 etc.

With respect to all the sensor arrangements mentioned above it may be contemplated that the sensor arrangement comprises at least one arrangement region in which a number w of the sensors is arranged in a square matrix.

This means that these w sensors are arranged in an equal number of rows and columns while the arrangement region need not be geometrically square.

Furthermore, it is now contemplated that the number of contact points which are connected to the electrodes of the w sensors arranged in the arrangement region is less than $w/2+w^{1/2}$, preferably less than or equal to $w/2+w^{1/2}/2$, more preferably less than or equal to $w/2+w^{1/2}/4$, even more preferably less than or equal to $w/2+w^{1/2}/6$, and most preferably equal to $w/2+2$ (wherein in each of the cases mentioned, $w/2+2$ preferably forms a lower limit).

It may be contemplated that the arrangement region comprises at least w=9, preferably at least w=16, more preferably at least w=25, and even more preferably at least w=36 sensors.

An interconnected sensor arrangement which exhibits the functional relationships between the number of sensors and the number of contact points as mentioned above combines the advantages of realizability in a single layer as is already apparent from the mentioned exemplary embodiments, and of a particularly small number of contact points per number of sensors.

In refinements of the invention, interconnections according to the following graph theoretical descriptions are contemplated.

It may accordingly be contemplated that the conduction areas and the electrode gaps define a bipartite planar graph, i.e. a graph representable without crossings, which comprises a plurality of nodes of a first set of nodes, a plurality of nodes of a second set of nodes, and a plurality of edges, with each of the edges extending between one of the nodes of the first set of nodes and one of the nodes of the second set of nodes.

In this case, the nodes of the bipartite graph correspond to the conduction areas: Those conduction areas which comprise a contact point of the first set define the nodes of the first set of nodes, and those conduction areas which comprise a contact point of the second set define the nodes of the second set of nodes.

The edges of the graph correspond to the interspaces between the electrode pairs, i.e. the sensor gaps: the electrode interspaces between the first and second electrodes of the sensors each define an edge between the two nodes that are defined by the two conduction areas which comprise the respective first and second electrodes. In short, the gaps between the electrode pairs correspond to the edges.

In particular, the first set of nodes may have a cardinality of two, and the second set of nodes may have a cardinality of greater than two. Furthermore, the bipartite graph can be complete.

In other words, a 2:N interconnection may be provided, with N=24, for example.

It may as well be contemplated that the plurality of sensors of the sensor arrangement is arranged in a matrix-type manner. It may accordingly be contemplated that the plurality of sensors arranged in the sensing zone is a number of u*v sensors, the sensors being arranged in a matrix having u rows and v columns.

In this situation, it is in particular contemplated that one of the sets of nodes has a cardinality of u*v/4 and that the other of the sets of nodes has a cardinality of at most u*v/4+u/2, preferably of at most u*v/4+u/4, more preferably of at most u*v/4+u/6 (in particular for the case of 6 rows and/or a multiple of 6 rows), even more preferably of at most u*v/4+3 and particularly preferably of u*v/4+2 (in particular for the case of at least 8 rows and/or a multiple of 4 rows) (wherein in each of the cases mentioned, u*v/4+2 preferably forms a lower limit).

Furthermore, each of the nodes of the set of nodes with cardinality u*v/4 has exactly four neighboring nodes connected by edges, and with respect to the other sets of nodes it applies that a number of at least u*v/4−u/2, preferably of at least u*v/4−u/4, more preferably of at least u*v/4−u/6, even more preferably of at least u*v/4−3 and particularly preferably of u*v/4-2 of the nodes each have four neighboring nodes connected by edges (wherein in each of the cases mentioned, u*v/4-2 preferably forms an upper limit), and that a (remaining) number of at most u, preferably of at most u/2, more preferably of at most u/3, even more preferably of at most 6 and particularly preferably of 4 of the nodes each have exactly two neighboring nodes connected by edges (wherein in each of the cases mentioned, 4 preferably forms a lower limit).

The same applies, of course, if rows are interchanged with columns so that the variables u and v are interchanged.

The invention further relates to a translation unit for a two-dimensional sensor arrangement in which the plurality of sensors is a number u*v of sensors that are arranged in a matrix having u rows and v columns.

The translation unit comprises one or more first contact point connections for connecting the contact points of the first set, and one or more second contact point connections for connecting the contact points of the second set.

Furthermore, the translation unit comprises a number u of first control connections and a number v of second control connections. Thus, the number of the first and second control connections corresponds to the number of rows and columns, respectively, of the sensors arranged in a matrix.

The translation unit is adapted to enable the sensor arrangement to be operated as if each of the first electrodes of the sensors arranged in the same rows were connected to the same first control connections and as if each of the second electrodes of the sensors arranged in the same columns were connected to the same second control connections.

Accordingly, the translation unit permits to operate a single-layered sensor arrangement interconnected without crossings with the same control electronics that is used for operating conventional sensor arrangements, in particular the arrangement described in the Background of the Invention with orthogonally extending and intersecting electrode strips that are separated by an insulation layer.

The invention moreover relates to a touchpad comprising a planar, in particular flat or curved substrate having an exterior facing outer substrate surface and an opposite inner substrate surface facing away from the exterior, and a two-dimensional sensor arrangement which is arranged on the inner substrate surface for interaction with an exteriorly located user.

Furthermore, the invention relates to a touchscreen comprising a planar, in particular flat or curved transparent substrate having an exterior facing outer substrate surface and an opposite inner substrate surface facing away from the exterior, and a two-dimensional sensor arrangement which is arranged on the inner substrate surface for interaction with an exteriorly located user.

The touchscreen furthermore comprises a planar, in particular flat or curved pixel-based display element for luminous representation of information, which has a front face facing the inner substrate surface and facing the exterior.

Furthermore, the invention relates to a touch-sensitive operating panel, comprising a planar, in particular flat or curved transparent glass or glass ceramic substrate having an exterior facing outer substrate surface and an opposite inner substrate surface facing away from the exterior, and having a two-dimensional sensor arrangement which is arranged on the inner substrate surface for interaction with an exteriorly located user.

The touch-sensitive operating panel furthermore comprises at least one planar, in particular flat or curved pixel-based display element for luminous representation of information, which has a front face facing the inner substrate surface and facing the exterior, and a support for mounting the display element preferably at a distance from the inner substrate surface.

The invention also relates to a cooktop comprising a touch-sensitive control panel which is preferably arranged in a cold area of the cooktop.

The invention furthermore relates to a method for producing a two-dimensional sensor arrangement on a preferably flat transparent substrate, in particular on a glass or glass ceramic plate, which method comprises at least applying a single-layered network of electrically conductive conduction areas onto the substrate.

The single-layered network of conduction areas comprises in particular: a plurality of electrode pairs consisting of a first electrode and a second electrode spaced apart from the first electrode by an electrically insulating electrode interspace; a plurality of electrically conductive contact points; a plurality of electrical connections between the electrodes and the contact points, which are either direct connections or are provided in the form of an electrically conductive electrode conductor; wherein the contact points, the electrode conductors, and the electrodes collectively define the conduction areas such that each of the conduction areas comprises one of the contact points and the electrodes and electrode conductors connected to the respective contact point.

Each of the contact points is connected to one or more of the first electrodes or to one or more of the second electrodes, so that a first and a second set of contact points is defined, the first set comprising those contact points which are connected to the one or more first electrode(s), and the second set comprising those contact points which are connected to the one or more second electrode(s).

Furthermore, any arbitrarily formed pair consisting of one of the contact points of the first set and one of the contact points of the second set is connected as a pair to the electrode pair of not more than one of the sensors.

The method may comprise (a) the application of a patterned, electrically conductive transparent coating, or the application of an electrically conductive patterned or full-surface coating and subsequent patterning (e.g. by laser), or the application of a polymer film or of a glass substrate with electrically conductive patterns onto a transparent substrate, preferably a glass or glass ceramic sheet, using at least one process selected from the group comprising printing, doctor blading, dipping, spraying, roll coating, rotary coating, slit coating/casting, curtain casting, flooding, physical or chemical vapor deposition, gluing, and laminating and bonding.

The method may furthermore comprise (b) the application of an opaque, patterned conductive coating, preferably after a method step (a), and preferably outside of the sensing zone of the sensor array.

Furthermore, the method may comprise (c) the application of further decorative layers (e.g. opaque colored, semi-transparent colored) and/or of protective layers (e.g. sealing, optical compensation layer, barrier layer) over the entire surface or on parts of the surface, patterned or recessed.

The sequence of steps (a), (b), and (c) is not fixed. The application of a coating onto the substrate using the described processes may comprise a respective drying step or respective curing of the coating by UV irradiation or IR radiation or thermal treatment, preferably in a temperature range from 100 to 500° C. for a period from 30 seconds to 3 hours.

Finally, the invention relates to a method for producing a user interface with a sensor panel comprising a sensor array, a display screen, an association unit, and a controller unit.

The method in particular comprises method steps for producing a substrate having a two-dimensional sensor arrangement.

The method may furthermore comprise mounting of a display screen preferably to a support unit, mounting of the support unit to the user interface substrate, also referred to as control substrate below, onto that face of the substrate on which the sensing cells are arranged (inner substrate surface), whereby contact elements which are preferably applied on the support unit are connecting the contact areas (contact points) of the transmitting and receiving electrodes to the contact areas (connection terminals) on the support unit.

The method may furthermore comprise mounting of a controller unit which is preferably implemented as a microcontroller, in particular on the support unit which is preferably in the form of a circuit board.

Furthermore the method may comprise establishing an association unit which may be mounted on the support unit in the form of hardware, e.g. as a microcontroller or a Field Programmable Gate Array (FPGA), or may be implemented as an additional software subroutine in the controller unit.

The display screen may be attached to the support by known assembly methods for electronic assemblies, by adhesive gluing, laminating, bonding, and/or mechanically by a screw-type or plug-in connection.

The support unit may be mounted to the inner substrate surface by means of a retaining unit, by adhesive gluing, laminating, bonding, and/or mechanically by snapping or screwing to a support frame attached on the user interface substrate, and/or mechanically by pressing onto the inner substrate surface.

The execution of the method in steps for which known and proven processes are employed in each case provides for easy and cost-efficient manufacturing of the sensor panel and a user interface.

DESCRIPTION OF THE DRAWINGS

The invention will now be explained in more detail with reference to the accompanying drawings. The same or similar elements are designated by the same reference numerals. The features of different exemplary embodiments may be combined with each other.

FIG. 1a shows a complete planar bipartite graph;

FIG. 1b shows a complete bipartite graph

FIGS. 1c and 1d show incomplete bipartite graphs;

FIG. 2a shows a sensor array as a 2:3 matrix group of sensing cells as a graph;

FIG. 2b shows the sensor array of FIG. 2a as a graph with split nodes;

FIG. 2c shows the sensor array of FIG. 2a a graph with nodes combined into a first node set;

FIG. 2d shows the sensor array of FIG. 2a as a layer layout of conductive areas;

FIG. 2e shows the sensor array of FIG. 2d as an abstracted view;

FIG. 5a shows the sensor array of FIGS. 4a and 4b with 2:N interconnection as an abstracted conductor layer layout FIG. 5b shows the sensor array of FIGS. 4a and 4b with 2:N interconnection as a complete planar bipartite graph FIG. 5c shows the sensor array of FIGS. 4a and 4b with 2:N interconnection as a minor of the graph of FIG. 5b;

FIG. 6 shows a conductor layer layout of an 8:6 sensor array of FIGS. 5a through 5c with 2:24 interconnection;

FIGS. 9c through 9g shows the left peripheral column from FIG. 9b with different variants of reconnection;

FIG. 13a shows six sensing cells in a 2:3 arrangement;

FIG. 13b shows the cells of FIG. 13a as a planar bipartite graph;

FIG. 14a shows six sensing cells in a 2:3 arrangement with a 2:3 column/row interconnection;

FIG. 14b shows the cells of FIG. 14a as a bipartite graph;

FIG. 14c shows the cells of FIG. 14a as a complete planar bipartite graph;

FIG. 15a shows a sensor array in a 2:3 matrix arrangement of sensing cells as a layout of sensor electrodes in the form of conductive areas;

FIG. 15b shows the array of FIG. 15a as a graph;

FIG. 15c shows the array of FIG. 15a as a layout of conductive areas with sensor electrodes, interconnections, and contact areas FIG. 15d shows the array of FIG. 15a as a graph;

FIG. 16a shows a matrix arrangement K:L=4:6 of sensing cells illustrated as individual graphs;

FIG. 16b shows the matrix illustrated as a graph with two-fold association of nodes (sensor electrodes);

DETAILED DESCRIPTION

Figure 3A:
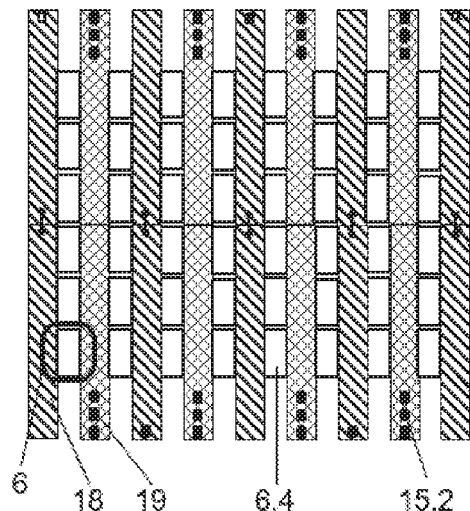
FIG. 3a shows a sensor array as an 8:6 matrix arrangement including eight 2:3 matrix groups as in FIGS. 2a through 2e as an abstracted conductor layer layout.

FIGS. 1a through 1d first introduces some terms from graph theory that are used in the present disclosure. FIG. 1a shows a complete bipartite planar graph $K_{2,3}$. Planar means that the graph can be illustrated in a plane without crossing edges, i.e. free of crossings. Bipartite means that the graph is composed of two node sets and each of the nodes is connected to nodes of the other set via edges 25. However, the nodes within a set of nodes are not interconnected to one another. The graph shown in FIG. 1a comprises a first set of nodes with a cardinality of 2 (squares nodes 23) and a second set of nodes with a cardinality of 3 (circular nodes 24). A graph is referred to as being complete if all nodes 23 of a first set of nodes are connected to all nodes 24 of a second set of nodes via edges 25.

FIG. 1b shows a graph $K_{3,3}$, that means both sets of nodes have a cardinality of 3. The graph is complete, bipartite, but not planar. Complete bipartite graphs $K_{3,N}$ with N>2 cannot be represented in a plane, that is to say not without crossings.

However, referring to FIGS. 1c, 1d, bipartite graphs $K_{M,N}$ with M,N>2 can sometimes be represented in a plane when they are no longer complete, that means when sufficient edges 25.6 are removed so that no crossings are left between the different remaining edges.

Edges 25 and 25.6 are part of the complete graph $K_{3,3}$. By omitting the edges designated as 25.6, by way of example, the graph becomes planar (crossing-free). Without the edges 25.6 we have two incomplete, bipartite, but planar graphs $K_{3,3}$ here. If the number of edges on each node is the same, one also speaks of regular graphs, in the other case of non-regular graphs.

Another parameter that will be used below is the degree of association. The degree of association of a bipartite graph indicates how many neighboring nodes (connected via edges 25) the nodes 23 of the first set of nodes have, and how many neighboring nodes (connected via edges 25) the nodes 24 of the second set of nodes have. A complete $K_{M,N}$ graph, i.e. with M nodes in the first set of nodes and N nodes in the second set of nodes, is distinguished by the fact that each of the M nodes of the first set of nodes has N neighbors and each of the N nodes of the second set of nodes has M neighbors. The degree of association is therefore $M_N:N_M$. Thus, the degree of association of the graph shown in FIG. 1a is $2_3:3_2$, that of the graph shown in FIG. 1b is $3_3:3_3$. The incomplete graphs of FIGS. 1c and 1d have a degree of association which is indicated by $3_{<3}:3_{<3}$.

Bipartite planar $K_{M,N}$ graphs with M nodes of a first set of nodes and N nodes of a second set of nodes will be used below for the description of single-layered sensor arrays with interconnected sensor electrodes and contact points. In this case, the nodes 23 of the first set of nodes correspond to the first electrodes of the sensors, the nodes 24 of the second set of nodes correspond to the second electrodes of the sensors (with the respective associated contact points) and the edges 25 correspond to the electrode interspaces, i.e. the sensor gaps between first and second electrodes of a sensor. Accordingly, the first and second electrodes of the sensors define a first and a second set of sensor electrodes. In the graphs of FIG. 1, the nodes 23 of the first set of nodes correspond to the sensor electrodes $SE_M$ of a first set of sensor electrodes, and the nodes 24 of the second set of nodes correspond to the sensor electrodes $SE_N$ of a second set of sensor electrodes. The sensors are also referred to as sensing cells, the contact points as contact areas.

With a physical arrangement of sensors in a K:L matrix and an interconnection of the electrodes of the sensors into an M:N matrix, typically a multiple association of the contact points to the electrodes of the sensors is achieved. This means that an interconnection of the sensor electrodes is effected which increases the number of associations of the sensor electrodes without losing uniqueness of the matrix points. Accordingly, each sensor cell $SC_{KL}$ is associated with precisely one unique sensor electrode pair including one sensor electrode from the first set of sensor electrodes and one sensor electrode from the second set of sensor electrodes.

The connection of electrodes is equivalent to the use of one and the same electrode (applied over a large area on the substrate) for a plurality of sensing cells. That means, a multiple association is made between the (first and/or second) sensor electrodes ($SE_M$ or $SE_N$) and individual sensing cells ($SC_{KL}$) in a manner so that a number of associations m or n of a sensor electrode ($SE_M$ or $SE_N$) becomes greater than one, by associating it with a plurality of sensor electrodes of the respective other set of sensor electrodes, via sensor gaps in each case.

This reduces the complexity, the error rate, and the cost of the arrangement and of the overall system, because the number of electrical connections is reduced, their length is shortened, and the number of contact areas of the sensor array and of connection points to the controller unit is reduced.

This can be quantitatively described in particular by a connection ratio CR. The connection ratio (CR) is the ratio of the number of sensing cells (SC) to half the number of contact areas (CA). Therefore, generally CR=2*SC/CA applies, and for an arrangement of K*L sensing cells and M+N contact points CR=2*K*L/(M+N).

The degree of association of an M:N interconnection can be described with the numbers of associations m and n of the sensor electrodes $SE_M$ and $SE_N$ and is indicated by $M_m:N_n$.

Preferably, each interconnected sensor electrode and each not interconnected sensor electrode is connected to exactly one contact area (CA). In a sensor array, a multiple association of the sensor electrodes may be identical for all sensor electrodes of the respective set of sensor electrodes $SE_M$ and $SE_N$ with association numbers m and n. In this case, all sensor electrodes of a first set of electrodes $SE_M$ will then be associated m times in the described manner, and all sensor electrodes of a second set of electrodes $SE_N$ will be associated n times in the described manner with sensor electrodes of the respective other set of sensor electrodes. One of the two sets of sensor electrodes can be used as the transmitting electrodes, while the other set of sensor electrodes is used as the receiving electrodes.

Optionally, sensor electrodes of one of the two sets of sensor electrodes may as well be additionally evaluated as self capacitance touch sensors or may define a self-capacitive sensing cell. In this case, an individual sensor electrode forms an open condenser surface, to which a finger or touching utensil of a user, upon touch, forms a second condenser surface. The resulting change in capacitance in the interconnection of the sensor electrode and its grounding via the user caused thereby permits to evaluate a current or voltage signal as a touch signal.

It may be contemplated that at least one electrode of a sensor is provided with a shielding electrode. For example, the electrodes of a self-capacitive touch sensor may be surrounded by a further set of electrodes which are designed as shielding and/or guard electrodes. Shielding electrodes are in particular operated at a fixed potential, preferably ground potential, in order to shield electromagnetic interference. Guard electrodes are preferably operated with the same sensor alternating potential which is a harmonic or pulsed alternating signal or a sequence of signal pulses. Preferably, no potential difference is produced between the self-capacitive sensor electrode and the guard electrode, so that no parasitic capacitive impedances are caused, whereby the signal-to-noise ratio of a touch signal on the single electrode sensor of a user is improved.

At least one sensor electrode, preferably each of the sensor electrodes, may preferably be connected to at least one of, for example, four signal buses, alternately and intermittently in time: a transmission bus Tx, a reception bus Rx, a signal bus Z for evaluating self-impedances, and a bus P with fixed potential, preferably ground potential. The signal buses may be physically implemented as four separate signal bus lines, or as less than four physically separate lines, in which case individual signal bus lines may be intermittently driven by the controller using different bus signals.

Individual sensor electrodes of a sensor may then be intermittently connected to the sensor bus signals Tx, Rx, or Z, while at the sampling time of this individual sensor other surrounding electrodes may be connected to bus signals Tx or P for guard or shielding purposes. It is furthermore possible to connect groups of sensor electrodes for a near-field or far-field detection. The functional electrodes can thus be represented in a planar and therefore crossing-free layer structure.

If a sensor array is operated alternately with self capacitance sensing cells and with projected capacitive (PCAP) sensing cells, this allows to better discriminate interference signals caused by liquid, for example, since the signal ratio between control operation and liquid will be represented differently by the two sensor types. This may also be important in an application on a horizontal control surface such as that of a cooking appliance.

Referring to FIG. 1a, the respective degree of association of this graph is $2_3:3_2$. The association of the corresponding sensor electrodes is complete for $2_3:3_2$, that means all nodes of a respective set of nodes are connected to the same number of edges. This is also referred to as a m,n-regular graph $K_{M,N}$. If the number of associations in the sensor array is not the same for every sensor electrode of one of the sets of sensor electrodes, such that peripheral electrodes have smaller numbers of associations by way of example, this will be referred to as an interconnection with a degree of association $M_{\leq m}:N_{\leq n}$ below, wherein m and n denote the highest numbers of association existing in the sensor array for the plurality of sensor electrodes, for example in the central region of the sensing zone in which sensor electrodes are provided in a symmetrical arrangement, in contrast to the peripheral region of the sensing zone in which peripheral electrodes are not symmetrically associated or connected. This corresponds to a non-regular $K_{M,N}$ graph. If a $M_m:N_n$ interconnection is complete, i.e. all possible edges are existing, then this corresponds to a complete bipartite $K_{M,N}$ graph which will automatically also be n- and m-regular in the two sets of nodes, and $M_m:N_n$ with m=N and n=M will apply.

As already described in the Background of the Invention, the simplest arrangement is characterized by the fact that for each sensing cell SC, electrical connections of the two sensor electrodes are individually routed out of the sensing zone to be connected to a controller unit. This will typically only exist in arrangements with a few sensing cells. Such an arrangement corresponds to Type 1 in Table 1 below. Type 1 has a connection ratio of $CR_{TYP1}=1$.

Type 1 (not interconnected individual sensing cells) has a degree of association of $M_1:N_1$. Each of the two respective sensor electrodes of a sensing cell is connected to a separate contact area. Although this arrangement can be represented in one layer and without crossings, it has the disadvantage that in case of a larger number of sensing cells it implies a great number of conductors in the sensing zone and contact areas in the contact zone of the sensor array, due to the unfavorable connection ratio of CR=1.

It is furthermore possible to interconnect all of the first electrodes of the sensors with each other and to use individual non-connected second electrodes. In other words, the first set of sensor electrodes then corresponds to a single sensor electrode, and the electrodes of a second set of sensor electrodes are each associated with the first sensor electrode, via respective sensor gaps. This corresponds to a 1:N interconnection and to Type 2 in Table 1 below. In Type 2, the number of contact areas is reduced compared to Type 1. Type 2 has a connection ratio of $CR_{TYP2}=2$.

Also as already described in the Background of the Invention, in case of a multilayered sensor array, row and column electrodes can be formed as strip electrodes and can be arranged in two conductor layers one above the other and galvanically insulated by an insulation layer made of a dielectric material or by being spaced from one another. This M:N interconnection as a whole corresponds to Type 3 in Table 1 below. Type 3 has a connection ratio of $CR_{TYP3}=2*K*L/(K+L)$.

This is a significant improvement over the trivial arrangement of non-interconnected sensing cells (Type 1). For example, as shown in Table 1, with a 12:8 matrix arrangement of sensing cells with an interconnection into 12 column electrodes and 8 row electrodes, the resulting number of contact areas (CA) 15.1, in particular contact areas on the conductor layers or the corresponding connection points to the control unit will be $CA_{TYP3;12.8}=20$, and the connection ratio will be $CR_{TYP3;12.8}=9^3/_5$ in this example. It becomes larger the larger the number of columns and rows becomes. The degree of association of the interconnection is $M_L:N_K=K_L:L_K$.

FIGS. 2 to 6 relate to single-layered sensor arrangements with 2:N interconnection of the electrodes and contact points.

In FIGS. 2a, 2b, and 2c, representations based on graph theory are compared to the conductor layer pattern of FIG. 2d and to an abstracted representation of the conductor layer pattern in FIG. 2e.

The exemplary embodiment of the entire K:L arrangement is an 8:6 matrix (FIGS. 3a and 3b), the basic cell shown in FIGS. 2a through 2e is a 2:3 arrangement group. The arrangement group comprises two columns each one with three sensors which are also referred to as sensing cells 6.

The sensing cells 6 in FIG. 2a are composed as follows: a respective node 23 in the first, left-hand column, a sensor gap 25.1, and a node 24 (listed from left to right). In the right-hand column a sensing cell 6 consists of (listed from left to right) a node 24, a sensor gap 25.1, and a node 23 (not shown) which is only supplemented when the basic groups are linked together.

In FIG. 2b, the three nodes 23 which are arranged in the sensing zone 5.1 are interconnected via edges 25.2 corresponding to connecting conductors, and the connection is routed out of the sensing zone 5.1 into the contact zone 5.2 where a node 23.2 is arranged as a connection point. In graph theory, the now interconnected nodes 23 correspond to a single node.

Furthermore, for each node 24 connection points 24.2 are individually routed into the contact zone 5.2, by means of edges 25.5 which again correspond to connecting conductors. In order to avoid edges 25.5 from crossing the edges 25.1 which correspond to the sensor gaps, i.e. from being routed through the electrode gaps, nodes 24 are split into two halves 24.1 so that the edges 25.5 can be routed through the split node. The split nodes are reconnected to each other and to the nodes 24.2 as the connection points (contact points) via connecting conductors 25.5 in the form of paired reconnections, via contact zone 5.2.

FIG. 2c shows that in the graph representation the individual nodes are combined into one node 23.

FIG. 2d illustrates the embodiment of the graph in FIG. 2c in form of a conductor layer pattern. Here, node 23 corresponds to the sensor electrode area 13.1 (belonging to a first set of sensor electrodes), edges 25.1 correspond to the sensor gaps 6.4, node 24 corresponds to the sensor electrode area 13.2 (belonging to a second set of sensor electrodes), the split nodes correspond to the sensor electrode areas 13.3, edges 25.2 correspond to the conductive areas 14 as connecting conductors, edges 25.5 correspond to the conductive areas 14.3 as reconnecting conductors of split sensor electrodes, and nodes 23.2 and 24.2 correspond to the contact areas 15.1 (contact points).

Sensor gaps 6.4 are only shown in an abstracted manner. They are provided as a non-conductive gap which may have a straight, curved, or meandering extension.

FIG. 2e shows an abstracted representation of the layer pattern. Here, areas 13.1, 14, and 15.1 are combined to form a group 18 of interconnected first sensor electrodes with a contact area.

In this case, the contact area 15.3 is a contact area of incompletely multiply associated sensor electrodes. This is because nodes 23 are peripheral nodes which are associated with only one edge 25.1 as a sensor gap (see FIG. 2a), in contrast to the nodes 24 which are each associated with two edges 25.1 as a sensor gap. Similarly, areas 13.2, 13.3, 14.3, and 15.1 are combined to form a group 19 of interconnected second sensor electrodes with contact area. In this case, the contact areas 15.2 are the three contact areas of the completely multiply associated second sensor electrodes (nodes 24). Over each sensor gap 6.4, a sensing cell 6 is situated, and it is located in the sensing zone 5.1, while the contact areas 15.2 and 15.3 are located in the contact zone of the sensor array.

Figure 3B:
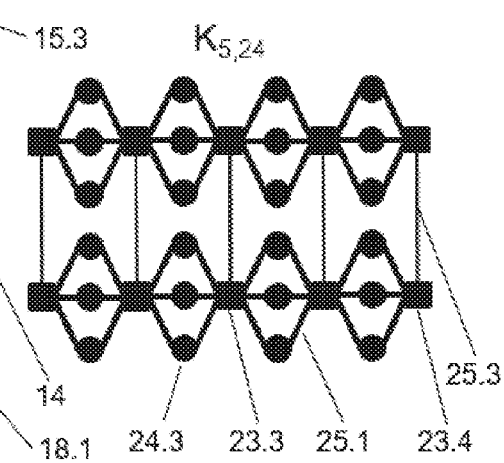
FIG. 3b shows the sensor array of FIG. 3a as an incomplete planar bipartite graph.

FIGS. 3a and 3b show the 8:6 matrix of sensing cells 6 composed of the basic groups of FIGS. 2a through 2e, in a single-layered 2:N interconnection.

Four basic groups of FIGS. 2a through 2e are linked together and terminated with a peripheral sensor electrode group 18.1 as a symmetry supplement. They represent the upper half of the sensor array (FIG. 3a). The lower half of the sensor array is obtained by mirroring the upper half at the horizontal symmetry axis of the entire array.

FIG. 3b shows the corresponding graph representation, wherein contact nodes 23.3 and 24.3 are not shown as routed outwards here.

The respective upper and lower halves of the first sensor groups 18 (corresponding to the left-hand column in FIGS. 2a through 2e) are each conductively connected to form a sensor group 18, by interconnections 25.3 and 14, respectively. The peripheral sensor groups 18 still have contact areas 15.3 of incompletely associated sensor areas.

Figure 4A:
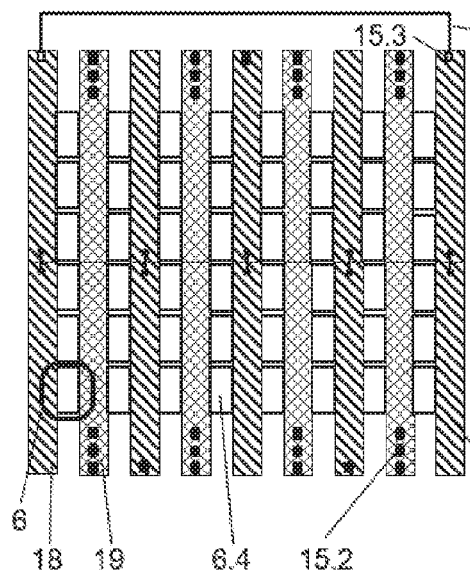
FIG. 4a shows the sensor array of FIGS. 3a and 3b with reconnection of used sensor electrodes/nodes as an abstracted conductor layer layout.
Figure 4B:
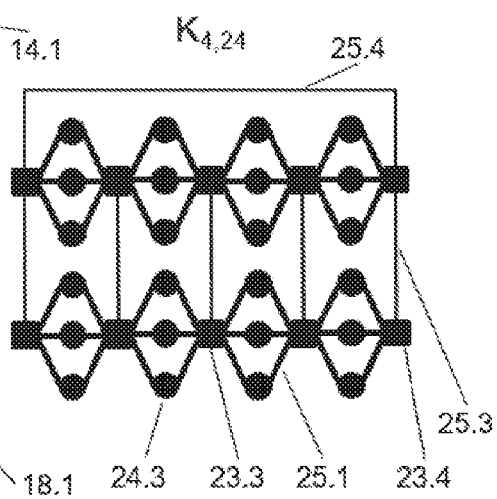
FIG. 4b shows the sensor array of FIGS. 3a and 3b with reconnection of used sensor electrodes/nodes as an incomplete planar bipartite graph.

In FIG. 4a, which shows an abstracted layer pattern, the two peripheral electrodes 18 are interconnected. In FIG. 4b it can be seen from the graph representation that every second node 24.3 corresponding to a second sensor electrode is associated twice, with a first node 23.4 and 23.3, respectively. Furthermore, a respective one of the four interconnected groups of nodes consisting of nodes 23.3 and 23.4, respectively, is associated with twelve second nodes 24.3 and therefore with twelve edges 25.1 each one corresponding to a sensor gap.

This interconnection is advantageously distinguished by a very small number of contact points (contact areas).

The properties of this interconnection are listed in Table 1 below under Type 5. In the exemplary embodiments "4:4" through "12:8" as calculated in the table, Type 5 has a smaller number of contact areas "CA" than Type 4. Otherwise stated, the connection ratio of Type 5 is greater than the connection ratio of Type 4: The connection ratio of Type 5 is $CR_{TYP5}=4*K*L/(K+K*L)>CR_{TYP4}=4*K*L/(2*K+K*L+2*L)$.

Type 4 in Table 1 below is to be understood as meaning, for example, that the first sensor electrodes $SE_M$ are interconnected in K columns, and the second sensor electrodes $SE_N$, twice associated but incompletely for the peripheral electrodes, remain not interconnected; that means we have an $M_L:N<_2$ interconnection. The connection ratio then is $CR_{TYP4}=4*K*L/(2*K+K*L+2*L)$.

Type 4 can therefore be improved into Type 5 by connecting the two outer second peripheral electrodes (reconnections), so that the interconnected peripheral electrodes are now also associated twice, and by additionally having the first sensor electrodes associated twice.

FIGS. 5a through 5c show a further advantageous interconnection step. The five physical column electrodes 18 which have already been interconnected into four column electrodes 18 by the interconnection of the peripheral electrodes, are now interconnected into two column electrodes 18. Altogether, this results in a 2:N interconnection of the sensor array.

This interconnection is achieved by the connecting conductors 14.2 (FIG. 5a, abstracted layer representation), or the corresponding reconnections 25.3 (FIG. 5b, graph representation), respectively.

Referring to FIG. 5b, the graph $K_{2,24*}$ now only consists of the two interconnected nodes of a first set of nodes 23.3 and twenty-four nodes of a second set of nodes 24.3.

The first interconnected nodes are now associated with twenty-four nodes of the second set of nodes and connected thereto via twenty-four edges 25.1 each one corresponding to a sensor gap. These are forty-eight edges 25.1 for the two first nodes, corresponding to forty-eight sensing cells 6.

As shown in FIG. 5c, the nodes 23.3 interconnected without crossings (FIG. 5b) can be combined into a total of 2 nodes 23.3 (FIG. 5c), resulting in the graph $K_{2,24}$ as a minor of $K_{2,24*}$. Thus, the layer pattern shown in FIG. 5a corresponds to a bipartite planar complete graph $K_{2,24}$. The layer pattern is designed in one layer without crossing, so that according to the invention there are neither crossing conductor layers nor connecting conductors routed through sensor gaps.

The properties of this interconnection are listed in Table 1 below as Type 6. The number of contact areas CA is once again reduced compared to Type 5, and accordingly the connection ratio is improved to give: $CR_{TYP6}=4*K*L/(4+K*L)>CR_{TYP5}=4*K*L/(K+K*L)>CR_{TYP4}=4*K*L/(2*K+K*L+2*L)$, with $CR_{TYP6}>CR_{TYP5}$ for K>4.

So Type 6 is resulting if in Type 5 the K column electrodes are interconnected to a total of two column electrodes. Therefore, we have a single-layered M:N interconnection with M:N=2:N. For the limit for large L and K, again CR→4 applies for Type 6.

Structurally, that is to say in terms of layout and complexity of the patterns, the complete 2:N interconnection and double association of the second sensor electrodes $SE_N$ (corresponding to a complete $K_{2,N}$ graph) of K*L sensing cells is significantly less complex than a non-interconnected arrangement (Type 1 in Table 1, see FIG. 16a for a 4:6 arrangement). In the 2:N interconnection, K first sensor electrodes $SE_M$ are interconnected to form two sensor electrodes, and the second sensor electrodes $SE_N$ are associated twice to the two interconnected first sensor electrodes SEM (Type 6 in Table 1, see FIG. 5c for an 8:6 arrangement). The degree of association is then $2_N:N_2$. The number of contact areas and connecting conductors between the contact areas and the associated sensor electrodes of non-interconnected sensor electrodes is $CA_{TYP1}=2*K*L$ and therefore more than twice the number $CA_{TYP6}=2+N$ for a complete 2:N interconnection. For type 1, the connection ratio CR of sensing cells to connected electrode pairs is $CR_{TYP1}=1$. For a 2:N interconnection, the following applies for the connection ratio in the limit case of a large number of columns K and rows L: $CR_{TYP6} \rightarrow 4$, i.e. equal to four sensing cells per connection pair. Even when compared to Type 4, advantageously, the number of contact areas CA is smaller and the connection ratios CR are higher for the exemplary arrangements "4:4", "8:4", "8:6", and "12:8" (see Table 1 below). Consequently, the electrical properties are considerably better, for example with regard to i) decoupling of the signals of different electrode pairs and their conductors, ii) interference resistance, and iii) signal-to-noise ratio. In addition, the costs of a 2:N interconnection are lower, since due to the simpler configuration the expenditure for design, maintenance and material can be reduced. A cost comparison with a two-layered K:L interconnection is also more favorable for a 2:N interconnection. Although for K:L=8:6 with $CA_{TYP6}=2+N=2+K*L/2=26$, for example, the complete 2:N interconnection has about twice as many contact areas as $CA_{TYP3}=K+L=14$ and therefore connections between the sensor array and the support unit, it will however be more cost-efficient due to the single-layered, crossing-free layout of the conductor layer. The reason for this is that only one coating step is necessary for the sensor array including the interconnections.

FIG. 6 shows an exemplary embodiment of a sensor array with sensors 6 and contact points 15.2. Here, we have a layer configuration of Type 6 (2:N interconnection) for a matrix of K:L=8:6 sensing cells.

The conductive layers which define the sensor electrode areas 13.1 of a first set of sensor electrodes and the sensor electrode areas 13.2 of a second set of sensor electrodes are located in the sensing zone 5.1 of the sensor array 5.

The conductive layers in sensing zone 5.1 are preferably transparent, so that a display screen 4 (see FIG. 10) which is arranged underneath is not significantly affected in its display function by these conductive areas.

Layers 13.1 and 13.2 are galvanically insulated from one another by electrically non-conductive areas 16 and 17.

Layers 13.1 and 13.2 may be applied in the described form by an application process such as screen printing. It is also possible for layers 13.1 and 13.2 to be first applied by an application process as a conductive surface in the form of a continuous conductive area and then be separated to form the desired patterns 13.1 and 13.2 in a subsequent step, for example by laser ablation.

In the sensing cell zone, the sensor electrode areas 13.1 and 13.2 are interleaved in a comb-like manner while being separated from each other by the sensor gap 17 (electrode interspace). The comb-like pattern is merely illustrated by way of example. A design with straight or curved lines or curved meandering patterns, for example, is likewise possible.

The electrically non-conductive areas, i.e. sensor gaps 17 may in particular have a width from 5 μm to 8 mm, in case of a pattern application process (such as screen printing) particularly preferably from 0.2 mm to 8.0 mm; in case of a subsequent patterning process (such as laser ablation) even less than 2000 μm, preferably less than 500 μm, more preferably less than 100 μm, and even more preferably less than 20 μm.

Within the sensor gap, there may be further galvanically decoupled coated areas (blind areas) which are made of the same transparent electrically conductive coating material as the sensor electrodes or the connecting conductors and only serve to provide a homogeneous visual appearance of the entirety of the transparent conductive areas. In other words, the separations by non-conductive areas 16 and 17 may be implemented in pairs so that, for example, blind areas are provided between two parallel conductive columns. These blind areas are spaced from the respective adjacent electrodes, e.g. sensor electrode areas 13.1 and 13.2, by preferably 1 to 50 μm, more preferably 5 μm to 30 μm, most preferably 10 μm to 20 μm. This is advantageous when, for example, sensor gaps in the order of millimeters are required, but separation by non-conductive layers 16 and 17 is to be accomplished in the order of 10 μm so as to be imperceptible for the human eye. The following relationships preferably apply for the gap widths d in the order of millimeters relative to the substrate thickness D: $\frac{1}{4}D<d<2D$ or $\frac{1}{2}D<d<D$.

The blind areas may have a width between 50 μm and 8 mm, more preferably between 100 μm and 2 mm. The blind areas in particular do not belong to the conductive areas of the network.

With the comb-like separations 17 as a sensor gap, the sensor electrode areas 13.1 and 13.2 with their interconnections as multiply associated sensor electrodes 22 with a unique combination of an area 13.1 and an area 13.2 in each case define a total of 48 sensing cells in an 8:6 matrix arrangement.

Sensor electrode areas 13.1 and 13.2 are connected to contact areas 15.2 via connecting conductors 14.1 to 14.3. Conductive areas 14.1 to 14.3 and 15.2 are located in the contact zone 5.2 of the sensor array 5. They may be transparent, but opaque as well.

The contact areas (contact points) serve to establish a connection between the sensor array and at least one controller unit as part of an electronic device. The connection between the contact points and the controller unit is realized as a plug-in connection, or as a conductive glue connection, or as a conductive pressure connection, for example. The connection may be galvanically conductive or capacitively conductive across a dielectric protective layer.

There are two conduction areas insulated from one another, each comprising interconnected areas 13.1, electrode conductors 14.1 and 14.2, respectively, and contact points connected thereto. These two conduction areas correspond to the two groups of sensor electrodes 18 with the associated contact areas in FIG. 5a.

In addition, there are twenty-four further conduction areas, each comprising areas 13.2, electrode conductors 14.3, and associated contact points 15.2. Six of such conduction areas arranged in a respective column correspond to a respective one of the groups of sensor electrodes 19 in FIG. 5a.

By way of example, in this 2:N=2:24 interconnection the two sensor electrode areas 13.1 of a first set of sensor electrodes are operated as receiving electrodes 6.2, and the twenty-four second sensor electrode areas 13.2 as transmitting electrodes. It may be even more advantageous that the two sensor electrode areas 13.1 of a first set of sensor electrodes are operated as transmitting electrodes 6.2 and the twenty-four second sensor electrode areas 13.2 as receiving electrodes. Sensor electrodes 13.1 and 13.2 are each capacitively coupled as pairs (mutual capacitance) via the non-conductive areas 17 as a sensor gap.

A sensor array (touch sensor array), in particular the sensor array 5 may be applied on a separate carrier substrate which may be connected to a display screen 4 or to a separate surface substrate (control panel substrate). The sensor array can as well be directly or indirectly integrated in the display screen 4 or in the surface substrate.

FIGS. 7 to 9 relate to single-layered sensor arrangements with M:N interconnection of electrodes and contact points and a degree of association of $M_4:N_4$ (see discussion of FIG. 1). This is also briefly referred to as $M_4:N_4$ interconnection.

FIGS. 7a through 7d compare the graph-theoretic representation with the conductor layer configuration, and with an abstracted representation of the conductor layer configuration for a basic group consisting of two columns of sensing cells with an $M_4:N_4$ interconnection.

The exemplary embodiment of the entire $M_4:N_4$ interconnection is a K:L=12:8 arrangement (FIGS. 8a and 8b), the basic cell is a 2:8 arrangement group (FIGS. 7a through 7d).

Figures 7A, 7B, 7C, 7D:
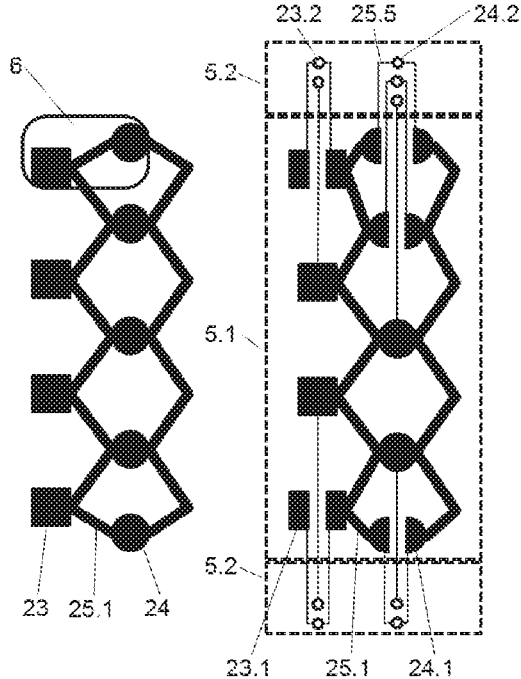
FIG. 7a shows a sensor array as a 2:8 matrix group of sensing cells with nodes used four times as a graph.
FIG. 7b shows a sensor array as a 2:8 matrix group of sensing cells with nodes used four times as a graph with split nodes.
FIG. 7c shows a sensor array as a 2:8 matrix group of sensing cells with nodes used four times as a layer layout of conductive areas
FIG. 7d shows a sensor array as a 2:8 matrix group of sensing cells with nodes used four times as an abstracted representation of FIG. 7c.

FIG. 7a shows, in a graph representation, two columns of eight sensing cells 6 each. In the first, left column, each of these sensing cells are composed of (listed from left to right) a respective node 23, a sensor gap 25.1 (i.e. an edge) and a node 24. In the right column a sensing cell 6 consists of (listed from left to right) a node 24, a sensor gap 25.1, and a node 23 (not shown) which is only supplemented when the basic groups are linked together.

In FIG. 7b, the peripheral nodes of the four nodes 23 are formed as split nodes 23.1. This permits to extend the inner two of the four nodes 23 through the split node and into the contact zone 5.2, via connecting conductor edges, without having crossings between the connecting conductor edges and the edges 25.1 (i.e. the sensor gaps). This means that the connecting conductor are not routed through the sensor gaps.

The two parts of the split nodes 23.1 are electrically connected by being connected to the same connection point 23.2 in the contact zone.

Furthermore, connection points 24.2 to each node 24 are individually routed out and into the contact zone 5.2, via edges as connecting conductors, and accordingly the peripheral ones of nodes 24 are split into two halves 24.1 and are reconnected to each other and to the node 24.2 as a connection point (contact points) via edges 25.5, as a reconnection.

FIG. 7c illustrates the graph of FIG. 7b as a conductor layer pattern. In this case, nodes 23 correspond to the sensor electrode areas 13.1 of a first set of sensor electrodes, edges 25.1 correspond to the sensor gaps 6.4, nodes 24 correspond to the sensor electrode areas 13.2 of a second set of sensor electrodes, split nodes 23.1 and 24.1 correspond to the sensor electrode areas 13.3, the connecting conductor edges correspond to the conductive areas 14 as connecting conductors, edges 25.5 correspond to the conductive areas 14.3 as reconnecting conductors of split sensor electrodes, and nodes 23.2 and 24.2 correspond to the contact areas 15.1.

The sensor electrode areas are associated four times via sensor gaps, i.e. the degree of association is $M_4:N_4$.

The sensor gaps 6.4 are only shown in abstracted manner. As already mentioned, they may be embodied as a non-conductive gap which extends straight or in curved or meandering manner, by way of example.

FIG. 7d shows a further abstracted representation of the layer pattern of FIG. 7c. Here, areas 13.1 and 14 and the associated contact points 15.1 are combined to form a group 18 of interconnected first sensor electrodes with contact points (contact areas) 15.3.

In this case, the contact area 15.3 is a contact area with incomplete four-fold association of the sensor electrodes. This is because nodes 23 are peripheral nodes which are each associated with only two edges 25.1 as a sensor gap (see FIG. 7a). By contrast, the nodes 24 are each associated with four edges 25.1 as a sensor gap.

Accordingly, the areas 13.2, 13.3, 14.3, and 15.1 are combined into a group 19 of interconnected second sensor electrodes with contact area. In this case, the contact areas 15.2 correspond to the three contact areas of the second sensor electrodes (nodes 24) with complete four-fold association, and the contact areas 15.3 correspond to the peripheral electrodes with only incomplete two-fold association.

Each sensor gap 6.4 with its two associated electrodes defines a sensing cell 6 (sensor). The sensors are located in the sensing zone 5.1, while the contact areas 15.2 and 15.3 are located in the contact zone of the sensor array.

Figure 8A:
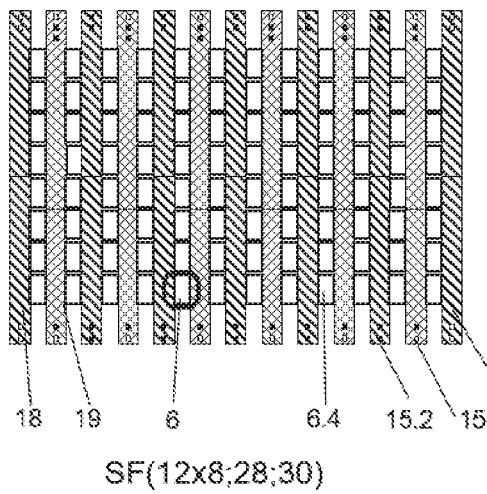
FIG. 8a shows a sensor array as a 12:8 matrix arrangement of six 2:8 matrix groups of FIGS. 7a through 7d as an abstracted conductor layer layout.
Figure 8B:
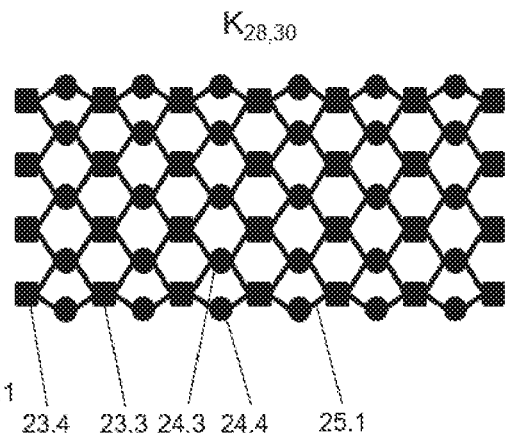
FIG. 8b shows a sensor array as a 12:8 matrix arrangement of six 2:8 matrix groups of FIGS. 7a through 7d as an incomplete planar bipartite graph.

FIGS. 8a and 8b show a 12:8 matrix composed of the basic groups of sensing cells 6 of FIGS. 7a through 7d in a single-layered M:N interconnection. Here, six basic groups are linked together and terminated with a peripheral sensor electrode group 18.1 as a symmetry supplement. FIG. 8b shows the corresponding graph representation, wherein the contact nodes 23.3 and 24.3 are not shown as being routed outwards here. The peripheral nodes 23.4 and 24.4 are each associated only twice, while the inner nodes 23.3 and 24.3 are each associated four times. Therefore, the peripheral sensor groups 18 and all sensor groups 19 still have contact areas 15.3 of incompletely associated sensor areas.

Figure 9A:
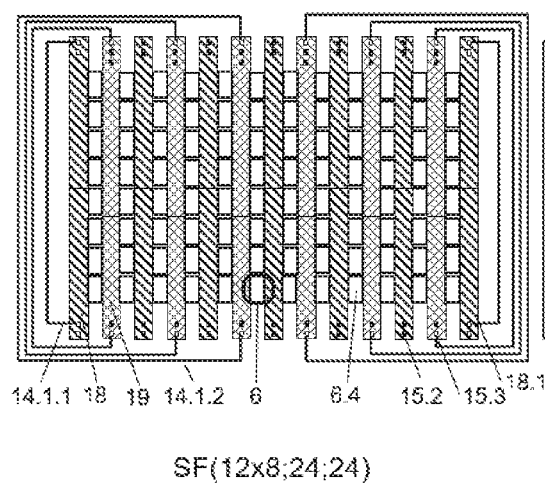
FIG. 9a shows the sensor array of FIGS. 8a and 8b with reconnection of incompletely used sensor electrodes as an abstracted conductor layer layout.

Referring to FIG. 9a which shows an abstracted layer configuration, some of the incompletely associated nodes 23.4 of the two peripheral electrode groups 18 and all of the incompletely associated peripheral nodes 24.4 of all electrode groups 19 are interconnected, by reconnections, to form pairs.

Figure 9B:
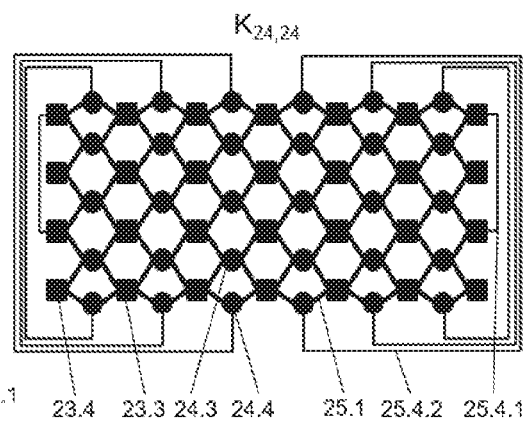
FIG. 9b shows the sensor array of FIGS. 8a and 8b with reconnection of incompletely used sensor electrodes as an incomplete planar bipartite graph.

FIG. 9b shows, in a graph representation, that many additional nodes (previously only associated twice) of the first set of nodes, 23.3 and 23.4, are now associated four times to a node of a second set of nodes, 24.3 and 24.4 (via edges 25.1 each corresponding to a sensor gap), and vice versa.

The properties of this interconnection are listed in Table 1 below under Type 10. In the exemplary embodiments "4:4" to "12:8" shown in the table, Type 10 has a lower number of contact areas "CA" than Type 4, for example. Hence, the connection ratio is also improved, $CR_{TYP10} > CR_{TYP4} = 4*K*L/(2*K+K*L+2*L)$.

Compared to the double-layered Types 7, 8, and 9 which relate to three- and four-fold associations of the sensor electrodes, Type 10 represents an advantageous single-layered crossing-free interconnection. Type 7, for example, is to be understood as a double-layered sensor electrode arrangement in which the sensor electrodes are associated four times, with the exception of the first and second peripheral electrodes, and in which the first sensor electrodes are interconnected to form four sensor electrodes, i.e. we have an $M_{<K*L/4}:N_4$ interconnection. The connection ratio CR is then: $CR_{TYP7} = 8*K*L/(2*K+16+K*L)$. Types 8 and 9 are to be understood as variants of Type 7, with a triple association of the sensor electrodes. The connection ratios are $CR_{TYP8} = 6*K*L/(9+K*L)$ and $CR_{TYP9} = 6*K/(3*L+K*L)$. The following applies for the connection rations for the limit of large K and L values: $CR_{TYP7} \to 8$ and $CR_{TYP8} \to 6$ and $CR_{TYP9} \to 6$.

However, as embodied in the case of Type 10, the sensor electrodes may also be associated four times in a single-layered design. Although the connection ratio is lower than for the two-layered embodiments, it is higher than in the single-layered interconnection Type 4, for example. In particular, the number of contact areas M+N of Type 10b is identical to that of Type 6, $CA(M+N) = \frac{1}{2}*K*L+2=N+2$, and therefore for the connection ratios also applies $CR_{TYP10} = CR_{TYP6}$, for (L mod 4)=0 and L≥8 for Type 10b (see Table 1). This means that in terms of the connection ratio, an $M_{<4}:N_4$ arrangement of Type 10b with (L mod 4)=0 and L≥8 corresponds to a $2_N:N_2$ arrangement of Type 6.

FIGS. 9c-g show the left peripheral column from FIG. 9b with different variants of reconnections. At the bottom of the representation, the resulting cardinality of the first set of nodes is indicated. For the right peripheral column, analogous connections may be contemplated. With reference to FIG. 9e, the number of lines u may be supplemented by 3 or multiples of 3. Referring to FIG. 9f, the number of lines u may be supplemented by 2 or multiples of 2, e.g. as shown in FIG. 9g.

The graphs in FIGS. 8b and 9b are bipartite planar incomplete $K_{24,24}$ graphs. The reason for this can be seen in the fact that, according to the graph theory, complete graphs $K_{M,N}$ with M>2 and N>2 are no longer planar; however, in the form of incomplete graphs a planar representation is possible. This corresponds to an incomplete degree of association $M_m:N_n$, n<M and m<N. The sensor electrodes $SE_M$ and $SE_N$ are associated with each other multiple times, but not completely.

The graphs shown in FIGS. 8b and 9b correspond to incomplete bipartite planar $K_{M,N}$ graphs with M>2 and N>2 and have an incomplete four-fold association $M_{<4}:N_{<4}$ in FIG. 8b and $M_{<4}:N_4$ in FIG. 9b of the sensor electrodes (non-regular graph). These configurations are distinguished by smaller numbers of contact areas CA and higher connection ratios CR than in Type 4.

Overall, Types 5, 6, and 10 are accordingly distinguished by a particularly low ratio of the number of contact points to the number of sensors. In other words, the connection ratio of these types is particularly high in each case. Accordingly, these configurations allow for an advantageous single-layered arrangement of sensor electrodes and connecting conductors including their interconnections on a substrate, for example on the lower surface of a user interface substrate. Single-layered herein means that neither interconnections are crossing each other nor are interconnections routed through sensor gaps. A single-layered arrangement and interconnection of the sensing cells provides for cost-efficient and less error-prone manufacturing.

The described 2:N and M:N interconnections therefore result in a small number of contact areas, in particular for a K:L sensor matrix. The interconnections are single-layered, i.e. free of crossings.

A 2:N interconnection with an association degree of $2_x:N_2$, x≤N in particular offers the advantage that the more costly reception channels can be reduced to two and the more cost-efficient transmission channels are designed to N. This interconnection requires an association unit, as described.

On the other hand, in terms of the signal-to-noise ratio it is advantageous when the receiving electrode has a small area. A small sensor area produces a better signal-to-noise ratio when actuated than a large sensor area, since the capacitive coupling to the actuating finger (self-capacitance) increases compared to the parasitic capacitive coupling of the sensor area remote from the finger to the environment, and the parasitic coupling to the surrounding electrodes remains small compared to the mutual capacitance of the sensor gap. Furthermore, it is advantageous if the active, receiving electrode is surrounded by conductive areas at a constant electrical potential, preferably ground potential. In this case, a 2:N interconnection with N reception channels and 2 transmission channels can be designed. Electrodes which do not belong to a directly sampled sensing cell may be placed at a preferred electrical potential.

Depending on the application, it is in particular possible to choose between interconnections $2_x:N_2$, x≤N and $M_{<4}:N_{<4}$. However, the invention is not limited to these interconnections. Interconnection degrees of $M_{<m}:N_{<n}$, with n from 2 to 4 and m from 2 to 4 are likewise possible in various embodiments. Preferably, the number of the sensor electrodes $SE_M$ and $SE_N$ and therefore also the number of sensing cells SC is a multiple of two in each case, i.e. K mod 2=0 and L mod 2=0.

An incomplete $M_{<4}:N_{<4}$ or $M_{<4}:N_4$ four-fold interconnection has a connection ratio CR<4, but for the limit for large K and L values the following holds: CR→4, like in the case of Type 6 for the 2:N interconnection. In the case of a $2_x:N_2$ interconnection with x≤N it is also advantageous for realizing a complete interconnection if the number of the sensing cells is a multiple of two.

In addition it should be noted that an incomplete five-fold association (5-regular incomplete $K_{M,N}$ graph with M>5 and N>5) can no longer be represented in a single plane. By contrast, incomplete $M_{<m}:N_{<n}$ associations for 5>m>3 and 5>n>3 (non-m,n-regular $K_{M,N}$ graphs with M>4 and N>4) can still be represented in a single plane. These associations and also associations with m=3 and n=3 or combinations thereof can be represented as incomplete associations in a single layer and without crossings.

Figure 10:
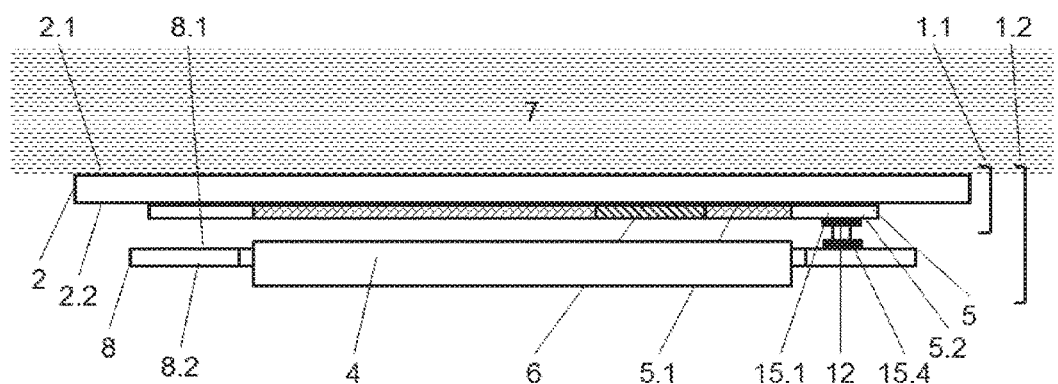
FIG. 10 is a sectional side view of a control panel consisting of a sensor screen, a display screen and a support unit.

FIG. 10 shows a control panel 1.2 consisting of a sensor panel 1.1, a support unit 8, and a display screen 4.

The sensor panel 1.1 is made from a transparent, preferably flat user interface substrate 2, most preferably in the form of a glass or glass ceramic sheet. The outer substrate surface 2.1 faces the exterior 7 in which the user of the control panel is situated. A sensor array 5 is mounted to the inner substrate surface 2.2 and is spatially divided into the sensing zone 5.1 and the contact zone 5.2. The sensing zone is the active area of the sensor array 5, where the user can trigger control operations and which is composed of sensing cells 6, i.e. of sensors. The outer substrate surface 2.1 provides a user interface for the user which the user may touch to control the electrical device. The inner substrate surface 2.2 on which sensing cells 6 of the sensor array 5 are arranged, faces away from the exterior 7 and from the user and is therefore located on the opposite side of the user interface surface 2.1.

The sensing zone 5.1 overlaps the display area of the display screen 4 and is transparent, as mentioned before. A support unit 8 is mounted so as to face the sensor array and has a central opening in which a display screen 4 is mounted. Display screen 4 provides graphical information for the user, originating from the display screen and transmitted across the sensing zone 5.1 of sensor array 5 and through the transparent user interface substrate 2 to be visibly displayed to the user situated in the exterior 7.

Contact elements 12 electrically connect the conductive areas of the sensor array to the conductive areas of the support unit 8. The contact elements 12 are mounted to the contact zone 5.2 of the inner substrate surface 2.2 and on the outward face 8.1 of the support so as to establish contact to the contact areas (contact points) 15.1 on the inner substrate surface 2.2 and to the contact areas (contact points) 15.4 on the outward face 8.1 of the support.

Contact areas 15.1 are preferably arranged in a contact zone 5.2 outside the sensing zone 5.1. Contact zone 5.2 surrounds the sensing zone 5.1, at least partially. Contact zone 5.2 preferably does not overlap the visualizing area of the display screen 4.

The flat support unit 8 has an outer support surface 8.1 facing the exterior 7. The flat user interface substrate 2 which preferably consists of glass or glass ceramic material, at least partially, has an outer substrate surface 2.1 facing the exterior 7 and an inner substrate surface 2.2 facing away from the exterior 7 and facing the outward face 8.1 of the support.

A control panel 1.2 may in particular be part of a household appliance, preferably a cooking appliance. The control panel 1.2 is preferably arranged in a cold area of a cooktop of a cooking appliance.

The sensor array 5 of the control panel 1.2 preferably comprises a K:L arrangement of sensors with a 2:N or M:N interconnection, wherein K, L, N, M>2 applies, and furthermore preferably comprises at least one further individual sensing cell having separate contact areas in the control panel. The separate sensing cell for instance provides the on/off switch of the electronic appliance, such as the cooking appliance. With regard to safety standards for on/off switches it may be contemplated to provide contacting and connection to the controller unit separately from the contacting of the K:L arrangement. It is also possible that an additional, second, independent controller unit is provided for this purpose.

The support unit 8 of control panel 2.1 is in particular adapted for supporting and/or retaining the display screen 4 (in particular a display unit in the form of an LCD, LED, OLED, plasma, EL, or projective screen). It may as well be in the form of a circuit board for electronic components which for example belong to a controller for the user interface and/or for the household appliance.

Figure 11:
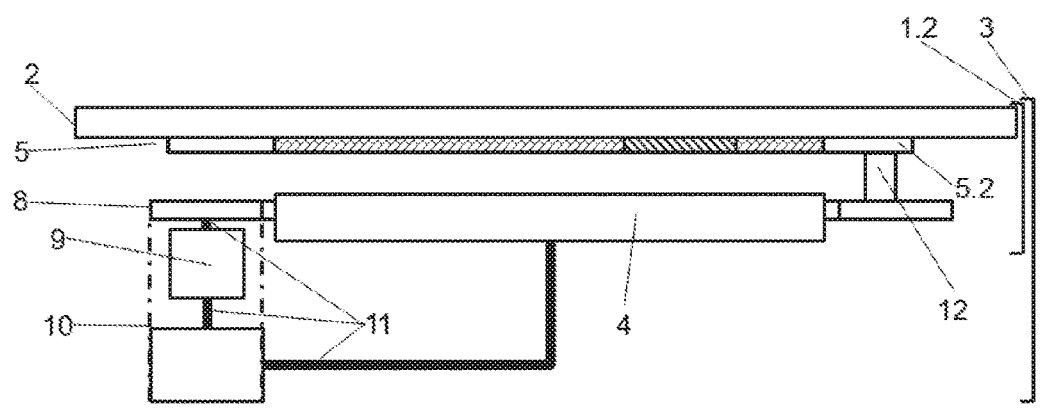
FIG. 11 is a sectional side view of a user interface.

FIG. 11 shows a graphical user interface 3 consisting of a control panel 1.2, a translation unit 9, which is also referred to as an association unit, a controller unit 10, and electrical connections 11 between support unit 8, display screen 4, association unit 9, and controller unit 10.

Association unit 9 may be a unit physically separated from the controller unit, which is for instance mounted to the support unit, or it may be part of the controller unit 10 in the form of electronic components and/or software or firmware.

A sensor panel 1.1 comprising a substrate and a sensor array 5 is particularly suitable for operating an electronic appliance, most preferably a household appliance. For this purpose, sensor panel 1.1 can be integrated in a household appliance. Preferably, the sensor panel 1.1 is part of a control panel 1.2 comprising a sensor panel 1.1, a support unit 8, and a display screen 4, or is part of a graphical user interface 3 comprising a control panel 1.2, an association unit 9, and a controller unit 10.

A graphical user interface 3 (GUI) comprising a control panel 1.2 and a controller unit 10 may constitute a combined input/output device. A sensor array 5 may interact with the display screen 4 in a manner so that the display screen 4 displays an interaction of the user with the sensor array 5. For this purpose, the sensor array 5 may be electrically connected to the display screen 4.

The sensor array 5 and the display screen 4 may furthermore be electrically connected to a controller for the user interface 3 or for the household appliance.

The controller unit 10 may for instance be mounted on a circuit board with further electronic components, as a microcontroller, and may be arranged spatially separated from the user interface 3, or may be arranged on the support unit 8. The software or firmware in the microcontroller is employed for controlling the sampling of the sensor array 5 and for interpreting the touch sequence of the sensing cells (sensors) as a tap touch operation or a two-dimensional swipe gesture.

It may be contemplated that the user interface substrate 2 of user interface 3 with sensor array 5 is part of a display unit, either as an outer substrate (on-cell arrangement) or as an inner substrate (in-cell arrangement) which is covered towards the exterior 7 or user area by an outer substrate of the display unit.

The display screen 4 of user interface 3 provides for visual output to the user. The information may be supplied to the display screen 4 in the form of an analog or digital signal from an exterior 7 of the user interface 3, preferably from a user interface controller. The PCAP sensing cells moreover enable input of data or information: When the user touches the user interface substrate 2 in a region of a sensing cell, in particular in a region of the sensor gap between the two sensor electrodes of the sensing cell, the sensing cell is able to generate a touch signal which is supplied by the user interface 3 to a controller 10 of the user interface 3 or of the electronic appliance, preferably in the form of an analog or digital signal.

The sensitivity and interpretation of the touch signals of the sensing cells may furthermore be adjusted so that control is made possible in the near field of the sensing cells, for example at a distance of ≤50 mm, ≤30 mm, or ≤10 mm without touching the user interface substrate. With an appropriate design of the sensing cells it is even possible to detect tap or gesture control operations in the near field above the sensor array 5.

Furthermore, signal detection may be adjusted so that an approach in the near field can be distinguished from a touch on the control surface. For example, it is possible in this manner to lighten and/or change the color of displays or of a portion of the display area or to change the presentation of information, in order to support more intuitive user guidance. Upon touch, the actual actuation operation is then effected. Furthermore, some electrodes of the entirety of the electrode arrangement, in particular in the peripheral region of the user interface arrangement may be evaluated by the controller in such a manner that it is possible to detect an approach of a user or a gesture control operation in the far field from the time sequence of the electrode signals, wherein the latter is preferably restricted to a distance of <300 mm, <200 mm, or <100 mm above the whole or above portions of the whole electrode arrangement. This may be exploited in particular for controlling higher priority functions, such as visually animated wake-up of the appliance when a user approaches, fast shutdown, selection of a cooking zone, or turn-on of a hood coupled with the cooking appliance. For the purpose of improved detection of such far-field gestures it is possible to provide some large area electrodes. It is furthermore possible, for near-field and/or far-field detection, to have some individual electrodes interconnected in a detection sequence so that they define a larger continuous electrode area. Near-field and/or far-field detection is preferably achieved in self-capacitance operation.

Furthermore, the display unit 4 is in particular controlled in response to the actuation of the sensor array, and control commands are forwarded to further optional controller units which control functions of the electronic appliance and information is received therefrom which may in turn be displayed on display unit 4. If there are no further optional controller units in the electronic appliance or optionally in addition to such further controller units, the controller unit of the GUI is at least partially responsible for controlling the function of the electronic appliance.

The association unit (translation unit) 9 translates the 2:N or M:N matrix interconnection, for example into an interconnection corresponding to the physical K:L matrix arrangement of columns/rows (see e.g. Type 3 in Table 1 below) in the sensor array. On the one hand this is necessary for correctly associating spatially adjacent sensing cells for the evaluation of gesture control signals, and on the other hand it may be necessary if a standardized controller unit is expecting a K:L interconnection and arrangement for sensor sampling and interpretation of the control signals of neighboring sensing cells.

Association unit 9 converts the K:L sensor sampling cycle into a 2:N or M:N sampling cycle. In other words, it translates the control signals obtained in the 2:N or M:N sampling cycle into the physical K:L arrangement of the sensing cell matrix.

Association unit 9 may be implemented in hardware, for example as a microcontroller or field programmable gate array (FPGA) which is arranged on the support unit 8. It is as well possible for the association unit 9 to be simply and cost-efficiently implemented in software in the controller unit, for example as an additional subroutine.

According to graph theory, it is impossible for the physical arrangement of a K:L matrix of sensing cells with K>2 and L>2 to be implemented as a conductive pattern in a single-layered sensor array with a matrix interconnected in a single layer and without crossings. Neither can it be implemented using additional passive connecting conductors on the substrate, since a set of electrodes, for example with K column electrodes, K>2, is already advantageously connected into two electrodes in the 2:N configuration, or into M and N electrodes in the M:N configuration, in order to reduce the number of contact areas to 2+N or to M+N. The 2:N and M:N interconnections include interconnections which do not exist in a conventional K:L interconnection and therefore cannot be undone by passive connecting conductors. This means that, advantageously, the association unit is an active element for translating the 2:N or M:N interconnection into a K:L association.

It is known from graph theory that complete 2:N matrix interconnections can still be represented without crossing. This corresponds to complete bipartite graphs $K_{2,N}$, with arbitrary N. These graphs are still planar. This means that the electrode pattern including their conductors to the controller unit 10 can be represented in a single conductor layer and without crossings, that is to say in one layer of conductive area elements without any need to route conductive connections through sensor gaps. This conductor layer may be applied on a curved or non-curved surface.

Referring to FIGS. 10 and 11, the sensor array 5 may be composed of K*L sensing cells that are physically arranged in a K:L matrix. Preferably, the sensor array is mounted to the inner surface of the user interface substrate (inner substrate surface), for interaction with a user situated in the exterior.

The sensing cells may each be composed of at least one transmitting and at least one receiving electrode and may in particular be interconnected without crossings in a 2:N matrix structure, preferably with N=1/2*K*L, or in an M:N matrix structure, for the limit case of large K and L preferably with M=N=1/4*K*L. It is preferred that none of the connecting conductors is routed through a sensor gap between a transmitting and a receiving electrode. The arrangement and interconnections in particular correspond to bipartite planar $K_{2,N}$ or $K_{M,N}$ graphs, and the transmitting and receiving electrodes 6.2 and 6.3 together with the contact areas associated therewith correspond to one of the two sets of nodes of the bipartite graph, and the sensor gaps 6.4 correspond to the edges of the graph. The sensing cells are preferably arranged in overlapping relationship with the display screen.

If a sensing cell is operated as a self-capacitive sensor, at least one of the two electrodes associated with a sensing cell can be operated (alternately) as a self-capacitive sensor. The respective second electrode and optionally further electrodes in the vicinity may be operated as guard or shielding electrodes.

Support unit 8 has conductor patterns at least on its outer surface 8.1, in particular contact areas 15.4 for contacting the contact areas 15.1 on the user interface substrate. For establishing electrically conductive connections between contact areas on the support and on the user interface substrate and thus with the sensor electrodes, or more generally for electrically connecting the conductor patterns of the substrate and the support, corresponding suitable contact elements 12 are provided. Contact elements 12 may capacitively contact the corresponding contact areas, across an insulating layer, or in electrically conductive manner (galvanically). Electrically conductive contact elements can be designed in various forms, for example in the form of spring contacts, or of electrically conductive flexible foams, or in the form of electrically conductive adhesive or solder connections, and also in the form of wire connections.

The substrate 2 is transparent for light emitted by the display screen 4, so that the display screen 4 is visible to a user through the substrate.

The outer substrate surface 2.1 which faces the exterior 7 and the user and which the user may touch for controlling the electronic appliance, is a control surface, also referred to as user interface surface. The substrate is preferably flat. According to another embodiment, the substrate may be curved, in particular even in the user interface area.

Figure 12A:
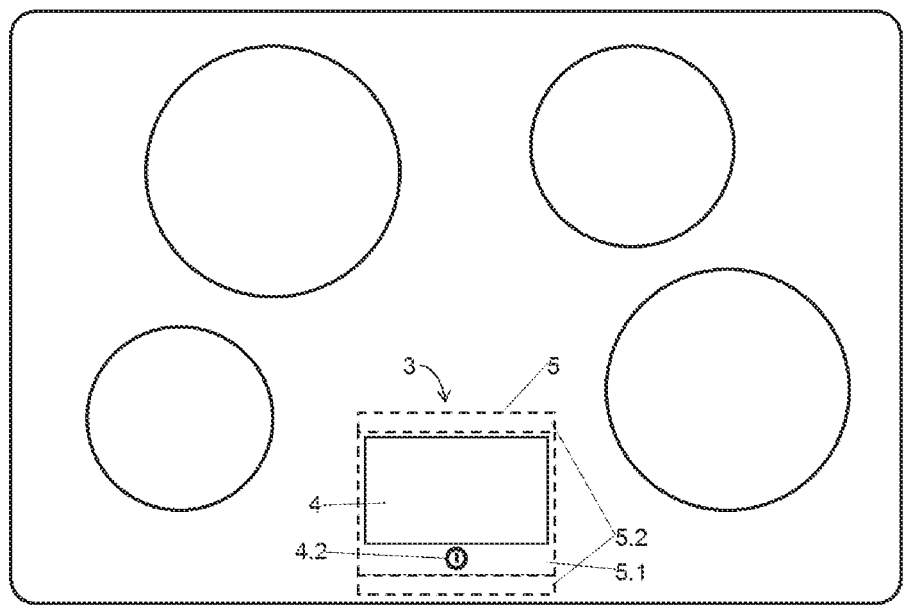
FIG. 12a shows a cooktop with user interface with a display and a power on/off pictogram indicator.
Figure 12B:
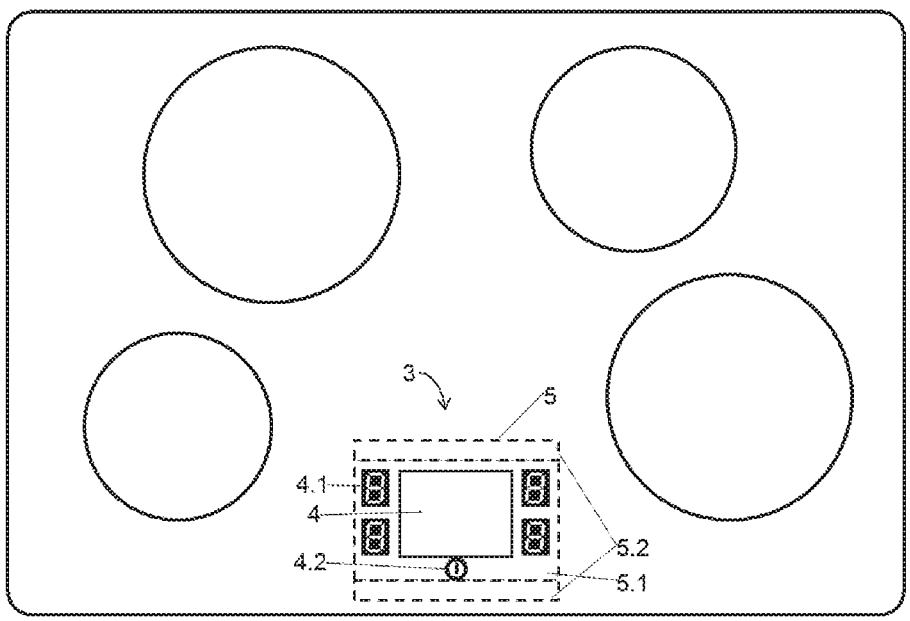
FIG. 12b shows a cooktop with user interface with with a display, segment displays for indicating the power of the cooking zones, and a power on/off pictogram indicator.
Figure 12C:
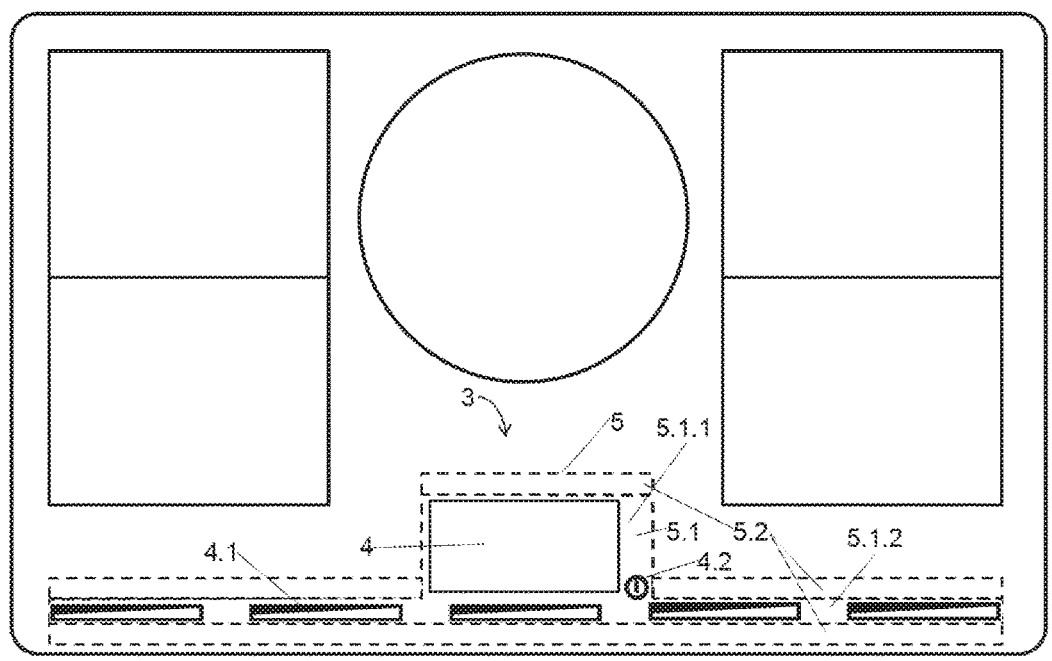
FIG. 12c shows a cooktop with user interface with a display, slider segment displays for indicating the power of the cooking zones, and a power on/off pictogram indicator.

FIGS. 12*a* through 12*c* show top plan views of embodiments for cooktops. FIG. 12*a* illustrates a cooktop with four cooking zones and with a user interface 3 which is mounted to the lower surface of the cooktop substrate and for which the sensor array 5, the sensing zone of sensor array 5.1, and the contact zone 5.2 of the sensor array are indicated.

A display screen 4 and a power on/off pictogram indicator 4.2 are arranged in the sensing zone. The display screen is a TFT LCD display, by way of example, which displays control, status and/or auxiliary information to the user, the display of information being accomplished across the K:L sensing cell matrix and across the cooktop substrate.

The on/off switch is implemented as an individual sensing cell which is backlit by the pictogram indicator and/or is superimposed by an on/off icon printed on the upper or lower surface of the cooktop substrate.

Referring to FIG. 12*b*, in addition to the central display screen 4 and an on/off pictogram indicator 4.2, segment displays 4.1 are arranged in the sensing zone. The power of a single cooking zone can be adjusted, for example with a swiping gesture by scrolling up and down the display over these 7-segment displays.

The display screen can be used to call up additional information and to make further settings by touch operation of the sensor array superimposed on the screen, for example for fetching recipe information, setting automatic cooking operations, settings a timer, fetching information from other networked domestic appliances or information from other networked information sources.

The sensor electrodes which are mounted to the lower surface of the cooktop substrate and the contact areas thereof are electrically connected in the contact zone 5.2 of the sensor array.

FIG. 12*c* shows a cooktop with five cooking zones which in addition to a display screen 4 and an on/off pictogram indicator 4.2 furthermore has five slide switch displays (sliders) 4.1 in the sensing zone 5.1.

The sensing zone 5.1 is no longer of rectangular shape here, but is partly adapted to the width of the cooktop. The sensing zone has sub-regions 5.1.1 and 5.1.2 in which the sensing cells may be arranged in different resolutions, for example with matrix arrangements K1:L1 (for 5.1.1) and K2:L2 (for 5.1.2), with K1<K2 and L1>L2.

Contact zone 5.2 may be arranged below and above the sensing zone along the entire width thereof, as shown by way of example here. It may, however, as well be reduced to a smaller area if the connecting conductors and contact areas are appropriately arranged in the sensor array.

As shown in FIGS. 12a to 12c, a sensor array can be designed individually for a respective cooktop using the described application methods. The support units with the display screens, on the other hand, can be fabricated as simple standardized modules and can be mounted at the appropriate locations below the cooktop substrate. This provides for a high degree of flexibility in the design of the user interface with a high degree of standardized support assemblies which are essentially limited to the arrangement of display screens or display elements. By contrast, tool costs for support units that include electronic circuit boards are high and require platform standardization.

The layout of the sensor array can thus be varied from device model to device model with comparatively low tool costs. It may be contemplated that the sensing cells and their contact areas are arranged in such a way that different support modules may be mounted with appropriate contacting, but also in different arrangements relative to one another. The displays can be arranged on the support modules without limitations of the kind that would arise if the touch sensors would be mounted on the support unit.

Without being limited to the exemplary embodiments shown, a sensor array 5 is preferably rectangular in shape and/or is adapted to the shape and size of a display unit 4. However, it may as well be designed in any other shape such as polygonal or round shapes, for example, and it may as well be combined of at least two rectangular matrix arrangements $K:L_1$, $K:L_2$, etc., with L1 smaller or greater than L2.

In particular above a display screen 4 such as a high-resolution graphic LCD display, the K:L arrangement of the sensing cells is a regular, checkerboard-like arrangement orthogonal in longitudinal and horizontal alignment. It may be provided that a display element is mounted on a support, wherein the support in turn is mounted to the substrate. The two-dimensional sensor arrangement, on the other hand, may be arranged directly at the substrate. Thus, the shape and size of the sensor arrangement may be independent of the display element. The sensor arrangement may in particular be larger and may as well span several display elements.

The dimensions or spacings of the sensing cells may be different in the longitudinal and horizontal directions. If instead of or in combination with a typically rectangular LCD display, further displays are arranged in the sensing zone of the user interface, for example segment displays or pictogram indicators, the arrangement area as a whole may be different from a typical rectangular shape so that the arrangement of the sensing cells may be designed with a variable number K of columns and a variable number L of rows.

For example, the arrangement may be composed of a matrix $K_1:L_1$ and $K_2:L_2$ in two adjacent areas, with K1 smaller or greater than K2, and with L1 smaller or greater than L2. It is likewise possible that the spacings, sizes, and shapes of the sensing cells vary in different areas of the sensing zone. The shape of the sensing zone as a whole may as well take other forms, such as polygonal, round, curved shapes instead of a rectangular shape, or it may be split into at least two sensing zones.

FIG. 13a shows an arrangement of six sensors 6 in two columns and three rows. Each of the sensors 6 comprises two electrodes (a first electrode 13.1, here on the left; and a second electrode 13.2, here on the right) which are spaced apart from each other by a gap 6.4.

The first electrodes 13.1, here on the left, of the sensors arranged in a column are interconnected (i.e., electrically connected to each other) by employing one large-area electrode. By contrast, the second electrodes 13.2, here on the right, are not connected to one another.

This is therefore an R:S interconnection in the sensing zone, with R=2 and S=6.

FIG. 13b shows a graph representation corresponding to FIG. 13a, with nodes 23 corresponding to the first, left electrodes 13.1, and with nodes 24 corresponding to the second, right electrodes 13.2. Edges 25 extend between nodes 23 and 24. An edge 25 together with two associated nodes corresponds to a sensor 6. A plurality of nodes 23 which are interconnected by edges 25.3 may be combined into one node 23. This results in a bipartite graph.

FIG. 14a shows the sensor array of FIG. 13a with electrode conductors 14. Electrode conductors 14 are connecting electrodes arranged in sensing zone 5.1 with contact points 15 arranged in contact zone 5.2.

The second, right-hand electrodes of a row are connected to each other in each case. This results in an M:N interconnection in the contact area, with M=2 and N=3. Thus, a further reduction of independent conduction areas has been achieved compared to the R:S interconnection in the sensing zone (FIG. 13a).

However, disadvantageously, the electrode conductors 14 are arranged in such a manner that they cross each other.

FIG. 14b shows a graph representation corresponding to FIG. 14a. The first electrodes 13.1 correspond to nodes 23.1 (square type), the second electrodes 13.2 correspond to nodes 24.1 (circular type), and the sensor gaps 6.4 correspond to edges 25.1 between nodes of different types. In order to obtain a bipartite graph, a plurality of nodes of the same type which are connected to each other by electrode conductors 25.2 are combined into one node.

FIG. 14c shows the bipartite graph so obtained. It can be seen from this graph that, in principle, a crossing-free interconnection of the sensor array shown in FIG. 14a would be possible, since none of the edges 25 are intersecting in the planar graph representation.

FIGS. 15a through 15d show how such a crossing-free interconnection may be implemented in practice. The interconnection shown in FIGS. 15a through 15d corresponds to that illustrated before, in FIGS. 2a through 2e.

The sensor array in FIG. 15a comprises two columns and three rows of sensors 6, like before in FIGS. 14a through 14c. Again, the first electrodes 13.1 (here the two outer ones) which are situated in the same column, are interconnected in the sensing zone (we have a common electrode in this case).

Moreover, the second electrodes 13.2 (here the three inner ones) which are situated in the same row are also interconnected (common electrode).

Referring to FIG. 15c, a crossing-free, i.e. single-layered interconnection of the electrodes in the sensing zone 5.1 with the contact points in the contact zone 5.2 is possible by having some of the second (inner) electrodes in the sensing zone split into two parts 13.3 and these two parts reconnected to each other in the contact zone, via reconnections 14.3. At the same time, contact points 15.1 are connected to the reconnections 14.3.

FIG. 15d shows a graph representation with split nodes corresponding to FIG. 15c. Contact points 15.1 correspond to nodes 23.2 and 24.2, respectively. Reconnections 14.3 correspond to edges 25.5.

FIG. 16a shows a sensor array in graph representation with twenty-four sensors 6 in four columns and six rows. Each sensor consists of a node 23, an edge 25.1, and a node 24.

FIG. 16b shows a sensor array in graph representation with again twenty-four sensors 6, in which the electrodes of each row are connected to one another. Two of the electrodes 23 of FIG. 16a are now connected into one node 23.3. Furthermore, two of the nodes 24 of FIG. 16a are connected into one node 24.3.

Figure 17A:
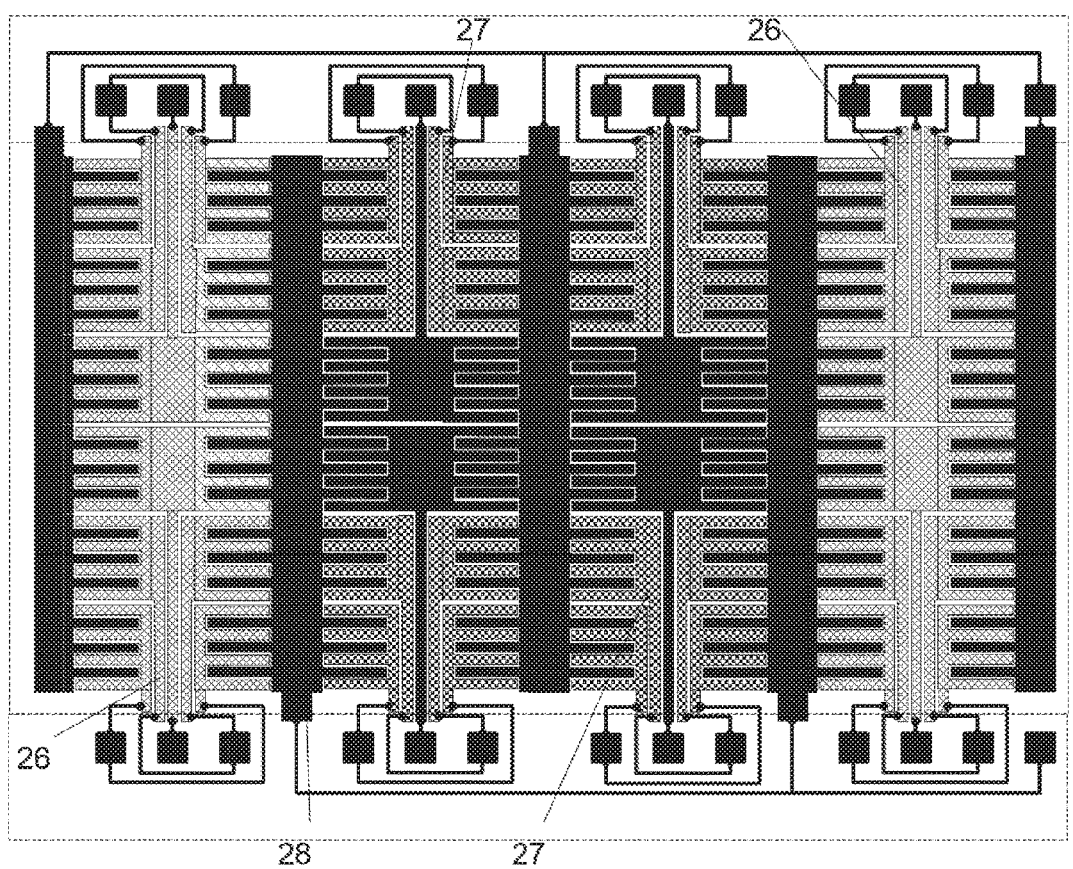
FIG. 17a through 17c show the sensor array of FIG. 6 with different interconnections of the electrodes to different bus signals.
Figure 17B:
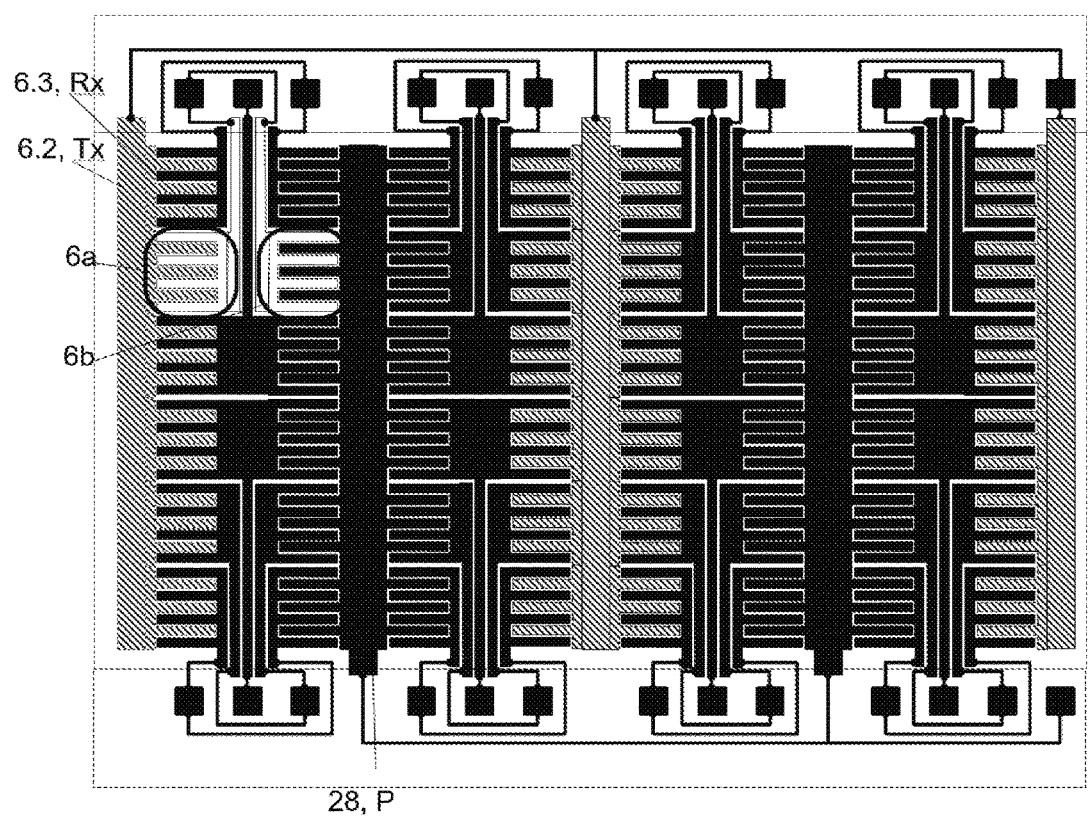
Figure 17C:
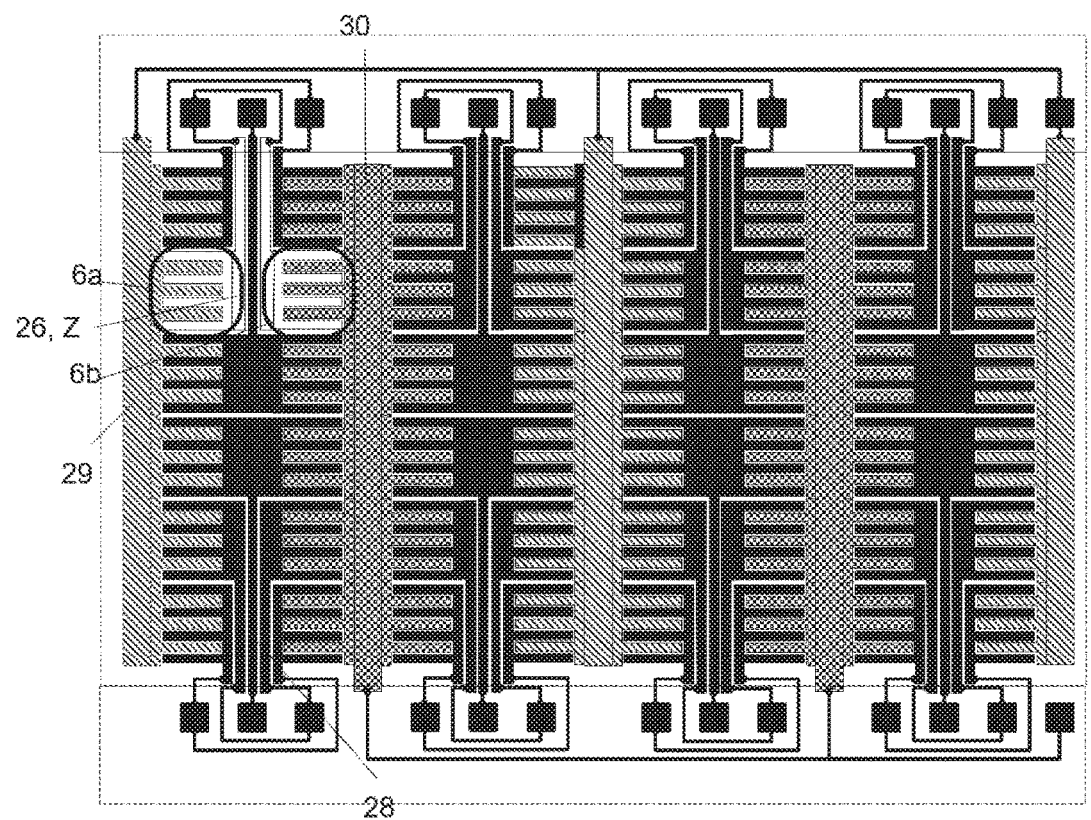

FIGS. 17a-c show the sensor matrix of FIG. 6 with different connections of the electrodes to different bus signals, so that different sensor functions are produced.

In FIG. 17a, a plurality of electrodes are interconnected into five different large-area electrode groups which serve to detect gesture control in the far field. The two separate electrodes 26 serve to detect motion in the horizontal direction, the two electrodes 27 serve to detect motion in the vertical direction. Electrodes 28 are interconnected to form a shielding electrode and are connected to the bus signal P, preferably a ground potential. Electrodes 26 and 27 are preferably alternately connected to the bus signal Z for control detection, and to the bus signal P for improved shielding in order to further shield any of the other electrodes connected to Z from interfering signals.

FIG. 17b illustrates the operation as a PCAP sensor in a 2:N electrode matrix. The receiving electrode 6.3 (bus signal Rx) (shown in white) serves two sensing cells 6a (left) and 6b (right). In sensing cell 6a, the receiving electrode 6.3 is spaced apart, by a sensor gap, from the transmitting electrode 6.2 (shown hatched) which is connected to the bus signal Tx. In sensing cell 6b, the electrode 28 (shown in black) which is spaced apart from electrode 6.3 is connected to a fixed potential, preferably ground potential (bus signal P). Therefore, the sensing cell 6a acts as an active sensing cell which is sampled with respect to a touch in this switching cycle. Cell 6b is inactive.

FIG. 17c illustrates the operation as a self-capacitive sensor in a 2:N electrode matrix. The electrode 26 is connected to the bus signal Z for self-impedance measurement. Electrodes 29 and 30 are alternately connected to the bus signals Tx as a guard electrode and to P at ground potential as a shielding electrode. The sensing cell 6a or 6b in which the shield signal is applied, forms the active sensing cell. There, the self-impedance signal upon touch will be greater than in the respective other cell in which the bus signal P is applied for shielding. The remaining electrodes 28 are connected to the bus signal P, for the purpose of further shielding. With this interconnection of a single electrode 26 as a self-capacitive sensor it is possible to locally detect a touch, an approach in the near field, and wetting by a water-containing liquid. With the interconnection as a PCAP sensor like in FIG. 17b it is possible to detect a touch with less interference by electromagnetic interfering signals, and in combination with the self-capacitive interconnection it is possible to more reliably discriminate wetting by a water-containing liquid from a control touch.

Figure 18:
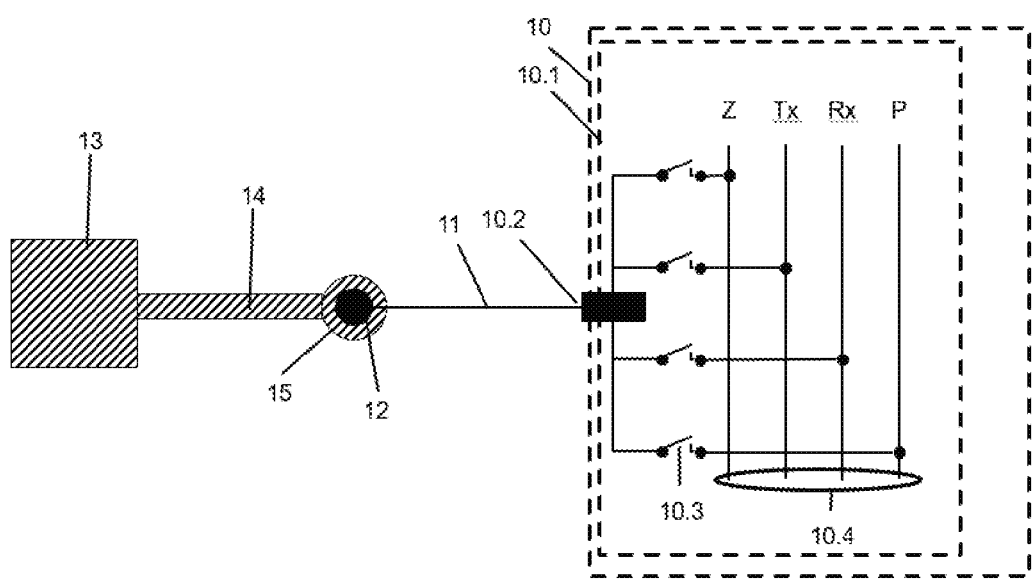
FIG. 18 shows a sensor electrode connected to a controller unit.

In order to be able to flexibly apply different signals to the electrodes, the latter are preferably connectable to different signal buses and designed so that they can be variably switched intermittently by the controller unit. FIG. 18 shows a sensor electrode 13 which is connected to a controller unit 10, at a connection point 10.2, via a conductive area 14, a contact area 15, a contact element 12 and a signal connection 11. 10.1 may be a microcontroller as part of a controller unit 10. In controller unit 10, the sensor electrode 13 is connected to not more than one of the signal buses 10.4 via signal switches 10.3. When connected to signal bus Z, the sensor electrode 13 constitutes a self-capacitive sensor for impedance measurement, or an approximation sensor for the near or far field, or a self-capacitive sensor preferably surrounding the control area as a conductive area for detecting a rather large, for example water-containing contamination. When connected to the signal bus Tx, the electrode 13 constitutes a transmitting electrode of a PCAP sensor or a guard electrode for adjacent self-capacitive sensors which are operated with the same sensor signal, in order to minimize the parasitic impedances of a self-capacitive sensor. When connected to the signal bus Rx, the electrode 13 constitutes a receiving electrode of a PCAP sensor. When connected to the signal bus P, the electrode 13 constitutes a shielding area, for example in the vicinity of a sampled PCAP sensor, or a guard electrode which preferably surrounds the control area.

Referring to all embodiments, the sensor gap between a pair of electrodes (i.e. a transmitting and a receiving electrode) may have an approximately rectilinear or meandering extension. Meandering areas may be jagged, or wavy or helical. The meandering extension causes an increase in the capacitance between the electrodes. With increasing length of the sensor gap, the signal-to-noise ratio improves. When a sensing cell (a sensor) is touched on the user interface surface, a base signal between the transmitting and receiving electrodes of a sensing cell is altered since part of the signal current is conducted to ground via the grounded finger or a grounded touching item. This can be detected by the controller as a touch operation.

A sensor gap may have an approximately constant width along its extension. Here, the shape or curved shape of the sensor gap along its length can be considered as its extension. The sensor gap may have a lateral extension relative to the user interface substrate surface; accordingly the receiving electrodes are arranged adjacent to the transmitting electrodes, as viewed from a perspective perpendicular to the user interface substrate surface.

A sensor electrode may be formed as an electrically conductive area element arranged on a substrate surface, in particular the inner substrate surface. A sensing cell (of a sensor) preferably has a surface area from 0.2 to 4.0 cm$^2$, more preferably from 1.0 to 2.0 cm$^2$.

A sensor electrode can be connected to a controller unit of the electronic appliance by means of a connecting line (or connecting conductor). The connecting line may be provided in the form of an electrically conductive area element arranged on a substrate surface, in particular the inner substrate surface.

A contact area between the connecting line and the controller unit may be provided in the form of an electrically conductive area element in a connection zone outside of an active control area of the sensor array, preferably on the inner substrate surface.

Preferably, an electrically conductive area element may be transparent for visible light. This ensures that, if the area elements are arranged between the display screen and the exterior in which the user is located, the view of the user is not disturbed or hindered by the area element when viewing the display screen.

Since each sensor electrode of the user interface may be provided in the form of an electrically conductive area element in particular on an inner substrate surface, the explanations with respect to the area element also apply to the transmitting electrodes and the receiving electrodes and the connecting areas and the contact areas.

The contact areas and connecting conductors in the peripheral area of the sensor array, i.e. outside the active sensing zone above the display screen, which are respectively associated with the sensor electrodes (via transparent conductive area elements or conductor tracks), may be implemented in the form of transparent conductive area elements. However, it is also possible for the contact areas and connecting conductors in the peripheral area of the sensor array to be provided in the form of opaque conductive area elements or conductor tracks. In the case that the contact areas and/or connection conductors in the peripheral area are implemented by opaque conductive area elements or conductor tracks, they may be arranged in overlapping relationship with the transparent conductive area elements in the peripheral area of the sensor array.

A substrate for the two-dimensional sensor arrangement, in particular for the user interface substrate, may comprise one of the materials selected from the group comprising plastics, glass, glass ceramics, and a composite of these materials. The substrate in question is preferably transparent, transparently dyed, or may non-dyed and transparent.

Glass preferably used includes the following types of glass: alkali-free and alkaline glasses, silicate glasses, borosilicate glasses, zinc silicate glasses, zinc borosilicate glasses, bismuth borosilicate glasses, bismuth silicate glasses, aluminosilicate glasses, lithium aluminosilicate glasses, lime-soda silicate glasses. The substrates may as well be chemically or thermally tempered, for example.

Preferably, a lithium aluminosilicate glass ceramic (LAS glass ceramic) is used as a substrate. Such a glass ceramic is for instance marketed under the trade name CERAN®. The glass ceramic need not be dyed, thus may be non-dyed, or it may be transparently dyed using metal oxides, e.g. of metals Ti, Zr, Va, Nd, Cr, Mo, Mn, Fe, Co, Ni, Cu, Zn, in particular by their addition, and/or heat processes. This glass ceramic is particularly suitable both for cooktops and also for being used as a substrate for the sensor array. Here, the comparatively high dielectric constant (relative permittivity $\in_r$) of typically 7.8 to 8.2 of the glass ceramic is important. The glass ceramic is very transmissive to heat and temperature-resistant and survives abrupt temperature shocks in a range of up to plus 750° C., and moreover it is very resistant to mechanical stress.

The substrate preferably has a thickness in a range from 0.015 to 6.0 mm, preferably in ranges 0.015 to 1.1 mm, 2.8 to 4.2 mm, 3.8 to 4.2 mm, or 2.8 to 3.2 mm.

The following materials may be used as a preferably flexible plastic substrate: polyethylene (PE), polypropylene (PP), polyvinyl chloride (PVC), polystyrene (PS), polyester (PES), and/or polycarbonate (PC). The plastic substrate preferably has a thickness in a range from 15 to 300 µm, more preferably between 20 µm and 100 µm. However, rigid plastic substrates of the above composition having a thickness of >300 µm may also be used.

A transparent electrically conductive layer for the sensor array may be applied to a user interface substrate as a full-surface area and/or may be patterned (e.g. by means of laser) and/or recessed, preferably after decorative, coloring, masking, barrier, and sealing layers have been applied to the inner substrate surface; (i) for substrates made of dyed glass ceramic material and/or of dyed glass material and/or dyed plastic material preferably after optional optical masking and/or filtering and/or compensation, barrier and/or sealing layers have been applied; (ii) for substrates made of non-dyed glass ceramic material and/or non-dyed glass material and/or non-dyed plastic material, preferably after optional decorative, color-imparting, optical filter layers and/or compensation, barrier, and sealing layers have been applied.

A sequence of producing the layer structure in which, for example, the decorative and/or sealing layers are applied after the conductive layer, and (i) the conductive layer is patterned before the further layers are applied and/or is applied as a full-surface area and/or is applied with recesses and/or (ii) the entire layer structure or portions of the layer structure is/are subsequently patterned (e.g. by laser) is also possible.

In both cases, an opaque conductive layer may be applied before or after the application of the transparent conductive layer. If, in the case of substrates made of non-dyed glass ceramic materials or non-dyed glass materials, opaque conductor layers are intended to not be visible exteriorly, the conductive layer is applied after the color-imparting coating, unless it is concealed by a top decor. In addition, a sealing layer may be applied to the opaque or transparent conductive coating for protecting it. The described combinations of the conductive layer with decorative and sealing layers will include an overlap in the edge regions of the printed layers in each case, so that a homogeneous transition can be ensured.

A display screen may be a display (LED, OLED, LCD, plasma, electroluminescence, etc.). However it is also possible that other display elements such as luminous pictograms, alphanumeric numeral displays, in particular segment displays, a line of light-emitting segments (so-called slider) or an arc or ring of light-emitting segments (ring slider), a light field, or a pixel-based display element, or combinations thereof are arranged spaced to each other on the outer face of the support and which can be operated via one or more sensor arrays having a 2:N or M:N matrix structure.

The luminous pictogram may be a power on/off switch, plus and minus keys, or a key switch, by way of example. The alphanumeric numeral display may include a seven-segment display. A row or arc of light-emitting segments consists of one or more luminous areas which indicate a setting range, such as the power setting on a cooktop. The display element may be based on an LED or an OLED light source. As a setting range display, a pixel-based display module may be used which displays alphanumeric or freely selectable symbols, for example a back-lit LCD matrix or a light point matrix or an OLED matrix.

On the outer substrate surface in the region of the (respective) display elements, the substrate may be provided with tactile markings such as finger grooves or straight or curved depressions for finger guidance or applications or bulges.

For applying an electrically conductive coating onto the substrate, a transparent thin film may be applied by vapor deposition, the thin film comprising:
  metals, preferably silver, copper, gold; and/or
  transparent semiconductors, preferably indium gallium zinc oxide; and/or
  transparent conductive oxide layers, preferably tin-doped indium oxide, or $In_2O_3$:Sn; fluorine-doped tin oxide, or $SnO_2$:F; antimony-doped tin oxide, or $SnO_2$:Sb; aluminum-doped zinc oxide, or ZnO:Al; niobium-doped titanium dioxide, or $TiO_2$:Nb; tantalum-doped titanium dioxide, or $TiO_2$:Ta; gallium-doped zinc oxide, or ZnO:

Ga; molybdenum-doped zinc oxide, or ZnO:Mo; or molybdenum-doped indium oxide, or In$_2$O$_3$:Mo.

In addition, one or more barrier layers may be applied onto the substrate by vapor deposition, before and/or after the deposition of the transparent conductive coating, the barrier layers comprising:
  oxides, preferably SiO$_x$, Al$_2$O$_3$; and/or
  nitrides, preferably SiN; and/or
  oxinitrides, preferably SiO$_x$N$_y$.

For applying a full-surface or a patterned electrically conductive transparent or opaque coating onto the substrate by printing, any of the following methods may be performed: screen printing, inkjet printing, offset printing, gravure printing, flexographic printing, or pad printing.

For producing a transparent conductive coating, preferably by printing, an ink may be applied onto the substrate which comprises one or more electrically conductive additives or a conductive polymer and a solvent, the solvent preferably evaporating after the ink has been applied. Also suitable are inks or pastes which contain electrically conductive polymers, for example poly(3,4-ethylene-dioxythiophene)/polystyrene sulfonate. Inks or pastes containing electrically conductive polymers may additionally contain further conductive additives.

For example it is possible to print thin, preferably ultra-thin opaque lines of less than 500 μm, preferably less than 100 μm, in the form of mesh-like patterns (wire mesh) using an ink or paste, the ink or paste preferably comprising metallic nanoparticles, more preferably silver, copper, and/or carbon nanoparticles. In a particular embodiment, these thin or ultra-thin lines may moreover be sharpened (reduction of edge roughness) and/or thinned by laser ablation. Application of inks and/or pastes, in particular of opaque inks and/or pastes, may be performed by inkjet, tampon, and/or transfer printing.

The ink may comprise a matrix material for improving the performance of the transparent conductive area with respect to scratch resistance or water vapor resistance. Furthermore, the ink may contain thickeners, leveling agents, defoamers, dispersing agents, and other additives.

The conductive additive may comprise fibrous conductive particles to allow for a formation of conductive networks, wherein fibers of the additive have an average diameter of <500 nm, preferably <200 nm, more preferably <100 nm which ensures good electrical conductivity while high transmittance is preserved, due to the nanoscale dimensions.

An aspect ratio length/diameter of a fiber may be in a range from 50 to 10,000, preferably between 85 and 1000.

However, the conductive additive may also comprise spherical particles, nanoparticles, or particle flakes.

The electrical resistance of the conductive coating may be adjusted through the concentration of the conductive additive.

The additive may comprise at least one of the following substances:
  metallic nanowires or nanotubes;
  inorganic materials or particles, preferably metals, alloys, non-oxidic or oxidic materials of fiber-like morphology;
  a metal selected from a list comprising: silver, copper, gold, aluminum, nickel, platinum, palladium, or an alloy of the metals from the list;
  coated metallic nanowires, in particular nickel-coated copper nanowires or polymer-coated metallic nanowires;
  conductive doped oxide particles and oxide nanoparticles and/or nanowires, in particular In$_2$O$_3$:Sn, ZnO:Al, SnO$_2$:Sb;
  carbon nanomaterials, in particular single-walled and multi-walled carbon nanotubes, graphene;
  inorganic non-oxidic nanowires, in particular metal chalcogenides;
  fibers made of conductive polymers.

The matrix material may comprise at least one of the following substances:
  UV or thermally curable polymers;
  UV or thermally organically crosslinkable hybrid polymer sol-gel materials;
  hybrid polymer sol-gel materials;
  nanoparticle-functionalized sol-gel materials;
  sol-gel materials with nanoparticulate fillers and/or inorganic sol-gel materials;
  electrically conductive sol-gel materials;
  electrically conductive polymers;
  glass fluxes, or glass frits.

A substrate coated with a transparent electrically conductive layer can have a transmittance (DIN 5036-1) in the wavelength range from 380 nm to 780 nm of at least 65%, preferably at least 75%, more preferably at least 85%. Total transmittance in the wavelength range from 400 nm to 700 nm of a substrate coated with a transparent electrically conductive layer can be at least 70%, preferably at least 80%, more preferably at least 85%. The haze value of a substrate coated with a transparent electrically conductive layer can be less than 10%, preferably less than 5%, more preferably less than 3%. The surface resistance of the transparent layer can be less than 500 Ohm/sq, preferably less than 300 Ohm/sq, more preferably less than 100 Ohm/sq.

For producing an opaque conductive coating, preferably by printing, an ink may be applied to the substrate, which includes electrically conductive additives and a solvent, wherein the solvent preferably evaporate after the ink has been applied. The electrically conductive additives may be additives based on nano- and microscale carbon such as carbon black, CNT, fullerenes, or graphite. In this case, the electrically conductive additives may be embedded in electrically non-conductive binders such as, e.g., polyacrylates, polycarbonates, polyurethanes, polyureas, epoxy systems, silicone resins, silicones, polyester resins, and/or sol-gel matrices.

For producing an opaque conductive coating, it is furthermore possible to deposit a silver, gold, or copper containing material by a vapor deposition process, e.g. by sputtering.

Furthermore, opaque electrically conductive layers may consist of precious metal nanoparticles, such as Au or Ag or Cu, and a glass flux and/or organic binder. Opaque electrically conductive layers may moreover be applied on the basis of silver conductive pastes, aluminum or copper pastes.

The conductive layers (transparent and opaque) may be patterned after having been applied. It does not matter whether they have already been applied in patterned fashion in a printing process (e.g. screen printing) or by masking during sputtering. In this case, the subsequent patterning would be a further patterning step. Patterning of the conductive layers may be effected by laser ablation or lithographically, for example.

TABLE 1

Comparison of some interconnection types for sensor arrays with sensors that are physically arranged in a K:L matrix.

| | | R:S interconnection in sensing zone | | M:N interconnection in contact zone | |
|---|---|---|---|---|---|
| | Type | Number R | Number S | Number M | Number N |
| 1 | Single-layered, individual cells, no interconnection | $K * L$ | $K * L$ | R | S |
| 2 | Single-layered, 1:N interconnection | 1 | $K * L$ | R | S |
| 3 | Double-layered, conductor crossings in sensing and/or contact zone | K | L | K | L |
| 4 | Single-layered, double association of second electrodes, reconnection of second split electrodes | K | $K * (L - 2) + K$ | K | $\frac{1}{2} * K * L + L$ |
| 5 | Single-layered, double association of first and second electrodes, reconnection of first peripheral electrodes | $K/2 + 1$ | $\frac{1}{2} * K * L$ | $K/2$ | $\frac{1}{2} * K * L$ |
| 6 | Single-layered, double association of first and second electrodes, reconnection of first peripheral electrodes | $K/2 + 1$ | $\frac{1}{2} * K * L$ | 2 | $\frac{1}{2} * K * L$ |
| 7 | Double-layered, conductor crossings only in contact zone, four-fold association of first and second electrodes | $>\frac{1}{4} * K * L$ | $>\frac{1}{4} * K * L$ | 4 | $\frac{1}{4} * K * L + \frac{1}{2} * K$ |
| 8 | Double-layered, conductor crossings only in contact zone, three-fold association of first electrodes | $\frac{1}{3} * K * L$ | $3 * K$ | $\frac{1}{3} * K * L$ | 3 |
| 9 | Double-layered, conductor crossings only in contact zone, three-fold association | $\frac{1}{3} * K * L$ | $K * L$ | $\frac{1}{3} * K * L$ | L |
| 10a | Single-layered, four-fold association of first and second electrodes, reconnection of second peripheral electrodes | $\frac{1}{4} * (K - 2) * L + \frac{1}{2} * 2 * L$ | $\frac{1}{4} * K * (L - 2) + \frac{1}{2} * K * 2$ | $\frac{1}{4} * (K - 2) * L + \frac{1}{2} * 2 * L$ | $\frac{1}{4} * K * L$ |
| 10b | Single-layered, four-fold association of first and second electrodes, reconnection of first and second peripheral electrodes L mod 4 = 0, L ≥ 8 | $\frac{1}{4} * (K - 2) * L + \frac{1}{2} * 2 * L$ | $\frac{1}{4} * K * (L - 2) + \frac{1}{2} * K * 2$ | $\frac{1}{4} * K * L + 2$ | $\frac{1}{4} * K * L$ |

TABLE 1-continued

Comparison of some interconnection types for sensor arrays with sensors that are physically arranged in a K:L matrix.

| | Type | Number of contact areas (top) and connection ratio (bottom) for exemplary K:L matrices | | | | |
|---|---|---|---|---|---|---|
| | | $K = 4$ $L = 4$ | $K = 8$ $L = 4$ | $K = 8$ $L = 6$ | $K = 12$ $L = 8$ | $K \to \infty$ $L \to \infty$ |
| 1 | Single-layered, individual cells, no interconnection | 32<br>1 | 64<br>1 | 96<br>1 | 192<br>1 | $\infty$<br>1 |
| 2 | Single-layered, 1:N interconnection | N/A | N/A | N/A | N/A | $\infty$<br>2 |
| 3 | Double-layered, conductor crossings in sensing and/or contact zone | 8<br>4 | 12<br>$5\frac{1}{3}$ | 14<br>$6\frac{6}{7}$ | 20<br>$9\frac{3}{5}$ | $\infty$<br>$\infty$ |
| 4 | Single-layered, double association of second electrodes, reconnection of second split electrodes | 16<br>2 | 28<br>$2\frac{2}{7}$ | 38<br>$2\frac{10}{19}$ | 68<br>$2\frac{14}{17}$ | $\infty$<br>4 |
| 5 | Single-layered, double association of first and second electrodes, reconnection of first peripheral electrodes | 10<br>$3\frac{1}{5}$ | 20<br>$3\frac{1}{5}$ | 28<br>$3\frac{3}{7}$ | 54<br>$3\frac{5}{9}$ | $\infty$<br>4 |
| 6 | Single-layered, double association of first and second electrodes, reconnection of first peripheral electrodes | 10<br>$3\frac{1}{5}$ | 18<br>$3\frac{5}{9}$ | 26<br>$3\frac{9}{13}$ | 50<br>$3\frac{21}{25}$ | $\infty$<br>4 |
| 7 | Double-layered, conductor crossings only in contact zone, four-fold association of first and second electrodes | 10<br>$3\frac{1}{5}$ | 16<br>4 | 20<br>$4\frac{4}{5}$ | 34<br>$5\frac{11}{19}$ | $\infty$<br>8 |
| 8 | Double-layered, conductor crossings only in contact zone, three-fold association of first electrodes | 9<br>$3\frac{21}{25}$ | 14<br>$4\frac{28}{41}$ | 19<br>$5\frac{1}{19}$ | 35<br>$5\frac{51}{105}$ | $\infty$<br>6 |
| 9 | Double-layered, conductor crossings only in contact zone, three-fold association | 10<br>$3\frac{3}{7}$ | 15<br>$4\frac{4}{11}$ | 22<br>$4\frac{4}{11}$ | 40<br>$4\frac{4}{5}$ | $\infty$<br>6 |
| 10a | Single-layered, four-fold association of first and second electrodes, reconnection of second peripheral electrodes | 10<br>$3\frac{1}{5}$ | 18<br>$3\frac{5}{9}$ | 27<br>$3\frac{5}{9}$ | 52<br>$3\frac{9}{13}$ | $\infty$<br>4 |
| 10b | Single-layered, four-fold association of first and second electrodes, reconnection of first and second peripheral electrodes $L \bmod 4 = 0, L \geq 8$ | N/A | N/A | N/A | 50<br>$3\frac{21}{25}$ | $\infty$<br>4 |

What is claimed is:

1. A two-dimensional sensor arrangement for detecting locations in two or three dimensions for touch-sensitive touchpads or touchscreens, comprising:
   a sensing zone with a plurality of sensors arranged therein; and
   a contact zone with a plurality of electrically conductive contact points arranged therein;
   each of the sensors comprising a pair of electrodes consisting of a first electrode and a second electrode spaced apart from the first electrode by an electrically insulating electrode interspace; and
   electrical connections provided between the electrodes and the contact points such that each of the electrodes is connected to one of the contact points and each of the contact points is connected to one or more of the electrodes;
   each of the contact points being connected either to one or more of the first electrodes or to one or more of the second electrodes so that a first and a second set of contact points is defined, the first set comprising those contact points which are connected to the one or more first electrodes, and the second set comprising those contact points which are connected to the one or more second electrodes;
   wherein any defined pair consisting of one of the contact points of the first set and one of the contact points of the second set is connected as a pair to a pair of electrodes of not more than one of the sensors; and
   wherein the electrical connections between the electrodes and the contact points are either direct connections or are provided in the form of an electrically conductive electrode conductor;
   wherein the contact points, the electrode conductors, and the electrodes collectively form a plurality of electrically conductive conduction areas each one comprising one of the contact points and the electrodes and electrode conductors connected to the respective contact point;
   wherein the conduction areas form a single-layered network;
   wherein the sensor arrangement comprises a plurality of adjacent rows in each of which some of the sensors are arranged adjacent to each other;
   the rows at least comprising one row $R_1$, one row $R_2$ adjacent to the row $R_1$, one row $R_3$ adjacent to the row $R_2$, and one row $R_4$ adjacent to the row $R_3$;
   wherein the first electrodes of the sensors arranged in the row $R_1$ and the first electrodes of the sensors arranged in the row $R_4$ are connected to a respective common contact point, which is designated as A;
   wherein the first electrodes of the sensors arranged in the row $R_2$ and the first electrodes of the sensors arranged in the row $R_3$ are connected to a contact point different from the contact point designated as A;
   wherein the second electrodes of the sensors arranged in the row R1 and the second electrodes of the sensors arranged in the row $R_4$ are connected to respective different contact points which are designated as plurality B; and
   wherein the second electrodes of the sensors arranged in the row $R_2$ and the second electrodes of the sensors arranged in the row $R_3$ are connected to the contact points designated as plurality B.

2. The two-dimensional sensor arrangement as claimed in claim 1, wherein each of the electrode interspaces between the first and second electrodes of the sensors is adjacent to those two conduction areas which comprise the first and the second electrode of the respective sensor.

3. The two-dimensional sensor arrangement as claimed in claim 1,
   wherein the rows comprise two peripheral rows R and R' which are distinguished by the fact of each having only one adjacent row; and
   wherein the first electrodes of the sensors arranged in the row R and the first electrodes of the sensors arranged in the row R' are connected to a common contact point.

4. A translation unit for a two-dimensional sensor arrangement as claimed in claim 1, in which the plurality of sensors is a number u*v of sensors arranged in a matrix having u rows and v columns, comprising:
   one or more first contact point connections for connecting the contact points of the first set;
   one or more second contact point connections for connecting the contact points of the second set; and
   a number u of first control connections and a number v of second control connections which allow to operate the sensor arrangement as if each of the first electrodes of the sensors arranged in the same rows were connected to the same first control connections, and as if each of the second electrodes of the sensors arranged in the same columns were connected to the same second control connections.

5. A touch-sensitive touchpad, comprising:
   a planar substrate having an exterior facing outer substrate surface and an opposite inner substrate surface facing away from the exterior; and
   a two-dimensional sensor arrangement as claimed in claim 1 being arranged on the inner substrate surface for interaction with an exteriorly located user.

6. A touch-sensitive touchscreen, comprising:
   a planar transparent substrate having an exterior facing outer substrate surface and an opposite inner substrate surface facing away from the exterior;
   a pixel-based display element for luminous representation of information, having a front face display surface facing the inner substrate surface and facing the exterior; and
   a two-dimensional sensor arrangement as claimed in claim 1 arranged on the inner substrate surface for interaction with an exteriorly located user.

7. A method for producing a two-dimensional sensor arrangement as claimed in claim 1 on a substrate, comprising applying a single-layered network of electrically conductive conduction areas onto the substrate.

8. A touch-sensitive control panel, comprising:
   a planar transparent glass or glass ceramic substrate having an exterior facing outer substrate surface and an opposite inner substrate surface facing away from the exterior;
   a pixel-based display element for luminous representation of information, having a front face display surface facing the inner substrate surface and facing the exterior;
   a support for mounting the display element at a distance from the inner substrate surface; and
   a two-dimensional sensor arrangement as claimed in claim 1 arranged on the inner substrate surface for interaction with an exteriorly located user.

9. A cooktop, comprising a touch-sensitive control panel as claimed in claim 8, which is arranged in a cold area of the cooktop.

10. A method for producing a touch-sensitive control panel as claimed in claim 8, comprising:

producing the two-dimensional sensor arrangement on the glass or glass ceramic substrate, including applying a single-layered network of electrically conductive conduction areas onto the substrate;

mounting a pixel-based display element to a support having connection terminals; and mounting the support to the substrate at that face of the substrate on which the single-layered network of electrically conductive conduction areas is applied, whereby contact elements which are applied on the support unit are connecting the contact points of the sensor arrangement with the connection terminals of the support unit.

11. A two-dimensional sensor arrangement for detecting locations in two or three dimensions for touch-sensitive touchpads or touchscreens, comprising:

a sensing zone with a plurality of sensors arranged therein; and a contact zone with a plurality of electrically conductive contact points arranged therein;

each of the sensors comprising a pair of electrodes consisting of a first electrode and a second electrode spaced apart from the first electrode by an electrically insulating electrode interspace; and electrical connections provided between the electrodes and the contact points such that each of the electrodes is connected to one of the contact points and each of the contact points is connected to one or more of the electrodes;

each of the contact points being connected either to one or more of the first electrodes or to one or more of the second electrodes so that a first and a second set of contact points is defined, the first set comprising those contact points which are connected to the one or more first electrodes, and the second set comprising those contact points which are connected to the one or more second electrodes;

wherein any defined pair consisting of one of the contact points of the first set and one of the contact points of the second set is connected as a pair to a pair of electrodes of not more than one of the sensors;

wherein the electrical connections between the electrodes and the contact points are either direct connections or are provided in the form of an electrically conductive electrode conductor;

wherein the contact points, the electrode conductors, and the electrodes collectively form a plurality of electrically conductive conduction areas each one comprising one of the contact points and the electrodes and electrode conductors connected to the respective contact point;

wherein the conduction areas form a single-layered network:

wherein the sensor arrangement comprises at least one arrangement region in which at least some of the sensors are arranged in a matrix so that each of the locations of the sensors in the arrangement region can be defined as a location $P_{ij}$ with a row index i and a column index j;

wherein the first electrodes of the four sensors arranged at locations $P_{12}$, $P_{22}$, $P_{13}$, and $P_{23}$ are connected to a common contact point which is designated as A;

wherein the first electrodes of the four sensors arranged at locations $P_{32}$, $P_{42}$, $P_{33}$, and $P_{43}$ are connected to a contact point different from the contact point designated as A;

wherein the second electrodes of the four sensors arranged at locations $P_{21}$, $P_{31}$, $P_{22}$, and $P_{32}$ are connected to a common contact point which is designated as B; and wherein the second electrodes of the four sensors arranged at locations $P_{23}$, $P_{33}$, $P_{24}$, and $P_{34}$ are connected to a contact point different from the contact point which is designated as B.

12. The two-dimensional sensor arrangement as claimed in claim 11, wherein the matrix comprises two peripheral rows with row indices i=1 and i=m, respectively;

wherein the second electrodes of the four sensors arranged at locations $P_{11}$, $P_{12}$, $P_{m1}$, and $P_{m2}$ are connected to a common contact point which is designated as C; and/or wherein the second electrodes of the four sensors arranged at locations $P_{13}$, $P_{14}$, $P_{m3}$, and $P_{m4}$ are connected to a contact point different from the contact point designated as C.

13. A two-dimensional sensor arrangement for detecting locations in two or three dimensions for touch-sensitive touchpads or touchscreens, comprising:

a sensing zone with a plurality of sensors arranged therein; and a contact zone with a plurality of electrically conductive contact points arranged therein;

each of the sensors comprising a pair of electrodes consisting of a first electrode and a second electrode spaced apart from the first electrode by an electrically insulating electrode interspace; and electrical connections provided between the electrodes and the contact points such that each of the electrodes is connected to one of the contact points and each of the contact points is connected to one or more of the electrodes;

each of the contact points being connected either to one or more of the first electrodes or to one or more of the second electrodes so that a first and a second set of contact points is defined, the first set comprising those contact points which are connected to the one or more first electrodes, and the second set comprising those contact points which are connected to the one or more second electrodes;

wherein any defined pair consisting of one of the contact points of the first set and one of the contact points of the second set is connected as a pair to a pair of electrodes of not more than one of the sensors;

wherein the electrical connections between the electrodes and the contact points are either direct connections or are provided in the form of an electrically conductive electrode conductor;

wherein the contact points, the electrode conductors, and the electrodes collectively form a plurality of electrically conductive conduction areas each one comprising one of the contact points and the electrodes and electrode conductors connected to the respective contact point;

wherein the conduction areas form a single-layered network:

wherein the matrix comprises two peripheral columns with column indices j=1 and j=n, respectively;

wherein the first electrodes of the four sensors arranged at the locations $P_{11}$, $P_{21}$, $P_{51}$, and $P_{61}$ are connected to a common contact point which is designated as D; and/or wherein the first electrodes of the four sensors arranged at locations $P_{1n}$, $P_{2n}$, $P_{5n}$, and $P_{6n}$ are connected to a contact point different from the contact point designated as D.

14. A two-dimensional sensor arrangement for detecting locations in two or three dimensions for touch-sensitive touchpads or touchscreens, comprising:
a sensing zone with a plurality of sensors arranged therein; and
a contact zone with a plurality of electrically conductive contact points arranged therein;
each of the sensors comprising a pair of electrodes consisting of a first electrode and a second electrode spaced apart from the first electrode by an electrically insulating electrode interspace; and
electrical connections provided between the electrodes and the contact points such that each of the electrodes is connected to one of the contact points and each of the contact points is connected to one or more of the electrodes;
each of the contact points being connected either to one or more of the first electrodes or to one or more of the second electrodes so that a first and a second set of contact points is defined, the first set comprising those contact points which are connected to the one or more first electrodes, and the second set comprising those contact points which are connected to the one or more second electrodes;
wherein any defined pair consisting of one of the contact points of the first set and one of the contact points of the second set is connected as a pair to a pair of electrodes of not more than one of the sensors;
wherein the electrical connections between the electrodes and the contact points are either direct connections or are provided in the form of an electrically conductive electrode conductor;
wherein the contact points, the electrode conductors, and the electrodes collectively form a plurality of electrically conductive conduction areas each one comprising one of the contact points and the electrodes and electrode conductors connected to the respective contact point;
wherein the conduction areas form a single-layered network; and
wherein the sensor arrangement comprises at least one arrangement region in which a number w of the sensors is arranged in a square matrix, and wherein the number of the contact points which are connected to the electrodes of the sensors arranged in said arrangement region is less than $w/2 + w^{1/2}$.

15. A two-dimensional sensor arrangement for detecting locations in two or three dimensions for touch-sensitive touchpads or touchscreens, comprising:
a sensing zone with a plurality of sensors arranged therein; and
a contact zone with a plurality of electrically conductive contact points arranged therein;
each of the sensors comprising a pair of electrodes consisting of a first electrode and a second electrode spaced apart from the first electrode by an electrically insulating electrode interspace; and
electrical connections provided between the electrodes and the contact points such that each of the electrodes is connected to one of the contact points and each of the contact points is connected to one or more of the electrodes;
each of the contact points being connected either to one or more of the first electrodes or to one or more of the second electrodes so that a first and a second set of contact points is defined, the first set comprising those contact points which are connected to the one or more first electrodes, and the second set comprising those contact points which are connected to the one or more second electrodes;
wherein any defined pair consisting of one of the contact points of the first set and one of the contact points of the second set is connected as a pair to a pair of electrodes of not more than one of the sensors;
wherein the electrical connections between the electrodes and the contact points are either direct connections or are provided in the form of an electrically conductive electrode conductor;
wherein the contact points, the electrode conductors, and the electrodes collectively form a plurality of electrically conductive conduction areas each one comprising one of the contact points and the electrodes and electrode conductors connected to the respective contact point;
wherein the conduction areas form a single-layered network;
wherein the conduction areas and the electrode interspaces define a bipartite planar graph which comprises a plurality of nodes of a first set of nodes, a plurality of nodes of a second set of nodes, and a plurality of edges, each of the edges extending between one of the nodes of the first set of nodes and one of the nodes of the second set of nodes;
wherein the conduction areas which comprise a contact point of the first set define the nodes of the first set of nodes and the conduction areas which comprise a contact point of the second set define the nodes of the second set of nodes; and
wherein the electrode interspaces between the first and second electrodes of the sensors each define an edge between the two nodes which are defined by the two conduction areas which comprise the respective first and second electrodes.

16. The two-dimensional sensor arrangement as claimed in claim 15, wherein the first set of nodes has a cardinality of two and the second set of nodes has a cardinality of greater than two, and wherein the graph is complete.

17. The two-dimensional sensor arrangement as claimed in claim 15,
wherein the plurality of sensors is a number $u*v$ of sensors which are arranged in the sensing zone in a matrix having u rows and v columns;
wherein the first set of nodes has a cardinality of at most $u*v/4 + u/2$;
wherein at least $u*v/4 - u/2$ of the nodes of the first set of nodes each have four neighboring nodes connected by edges;
wherein at most u of the nodes of the first set of nodes each have two neighboring nodes connected by edges;
wherein the second set of nodes has a cardinality of $u*v/4$; and
wherein the nodes of the second set of nodes each have exactly four adjacent nodes connected by edges.

* * * * *